(12) United States Patent  
Shin

(10) Patent No.: US 8,148,260 B2  
(45) Date of Patent: Apr. 3, 2012

(54) SEMICONDUCTOR MEMORY DEVICE AND METHOD OF FORMING THE SAME

(75) Inventor: Kyoung-Sub Shin, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 474 days.

(21) Appl. No.: 12/232,962

(22) Filed: Sep. 26, 2008

(65) Prior Publication Data

US 2009/0085083 A1   Apr. 2, 2009

(30) Foreign Application Priority Data

Oct. 2, 2007 (KR) .......................... 10-2007-099409

(51) Int. Cl.
*H01L 21/8242* (2006.01)
(52) U.S. Cl. .............................. 438/637; 257/E21.658
(58) Field of Classification Search .................. None
See application file for complete search history.

(56) References Cited

U.S. PATENT DOCUMENTS

| | | | | |
|---|---|---|---|---|
| 6,483,143 B2 * | 11/2002 | Matsui et al. | ................ | 257/311 |
| 6,930,341 B2 * | 8/2005 | Park et al. | ..................... | 257/296 |
| 6,967,150 B2 * | 11/2005 | Yun et al. | ....................... | 438/586 |
| 7,074,718 B2 | 7/2006 | Kim et al. | | |
| 7,411,240 B2 * | 8/2008 | Park et al. | ..................... | 257/306 |
| 2006/0138561 A1 * | 6/2006 | Seo et al. | ....................... | 257/382 |
| 2007/0152257 A1 * | 7/2007 | Park et al. | ..................... | 257/308 |
| 2007/0281461 A1 * | 12/2007 | Jang | .............................. | 438/622 |
| 2008/0003866 A1 * | 1/2008 | Bae et al. | ...................... | 439/417 |
| 2009/0020879 A1 * | 1/2009 | Lee et al. | ...................... | 257/773 |

FOREIGN PATENT DOCUMENTS

| | | |
|---|---|---|
| KR | 1020020002680 | 1/2002 |
| KR | 1020020094520 | 12/2002 |
| KR | 1020050066164 | 6/2005 |

* cited by examiner

*Primary Examiner* — Benjamin Sandvik
(74) *Attorney, Agent, or Firm* — Harness, Dickey & Pierce, P.L.C.

(57) ABSTRACT

Provided may be a semiconductor memory device and a method of forming the semiconductor memory device. The memory device of example embodiments may include a bit line structure including a bit line on a semiconductor substrate, and a buried contact plug structure including a buried contact pad and a buried contact plug that extends in a lower portion of the bit line from one side of the bit line and connected to the buried contact pad. A width of the buried contact plug near a top surface of the buried contact pad may be greater than a width of the buried contact plug adjacent to the bit line.

4 Claims, 26 Drawing Sheets

SEMICONDUCTOR MEMORY DEVICE AND METHOD OF FORMING THE SAME

PRIORITY STATEMENT

This U.S. non-provisional patent application claims priority under 35 U.S.C. §119 to Korean Patent Application No. 2007-99409, filed on Oct. 2, 2007, in the Korean Intellectual Property Office, the entire contents of which are incorporated herein by reference.

BACKGROUND

1. Field

Example embodiments relate to a semiconductor memory device and a method of forming the same, and more particularly, to a dynamic random access memory and a method of forming the same.

2. Description of the Related Art

An increased integration of a dynamic random access memory cell may be beneficial. Accordingly, forming a buried contact plug which connects a capacitor to a source or a drain of a transistor and a bit line contact which connects a bit line to a source or a drain of a transistor may become difficult. For example, a buried contact pad may not be vertically aligned with a buried contact plug.

SUMMARY

Example embodiments provide a semiconductor memory device and method of forming the same. The semiconductor memory device may include a bit line structure including a bit line on a semiconductor substrate, and a buried contact plug structure including a buried contact pad and a buried contact plug extending in a lower portion of the bit line from one side of the bit line and connected to the buried contact pad. A width of the buried contact plug near a top surface of the buried contact pad may be greater than a width of the buried contact plug adjacent to the bit line.

Example embodiments provide a method of forming a semiconductor memory device. The method may include forming a buried contact pad and a bit line on a semiconductor substrate, and forming a buried contact plug on one side of the bit line and connected to the buried contact pad. A width of the buried contact plug near a top surface of the buried contact pad may be greater than a width of the buried contact plug adjacent to the bit line.

In example embodiments, a contact resistance between the buried contact pad and the buried contact plug may be improved.

BRIEF DESCRIPTION OF THE FIGURES

Example embodiments will be more clearly understood from the following detailed description taken in conjunction with the accompanying drawings. FIGS. 1-7C represent non-limiting, example embodiments as described herein.

FIG. 1 is a top plan view of a cell region of a memory device in accordance with example embodiments.

FIG. 2 is a cross sectional view taken along the line I-I' of FIG. 1 in accordance with example embodiments.

FIG. 3 is a cross sectional view taken along the line I-I' of FIG. 1 in accordance with example embodiments.

FIG. 4 is a cross sectional view taken along the line I-I' of FIG. 1 in accordance with example embodiments.

FIGS. 7a through 7c are cross sectional views taken along the line I-I' of FIG. 1 illustrating a method of forming a memory device in accordance with example embodiments.

Figure 1:
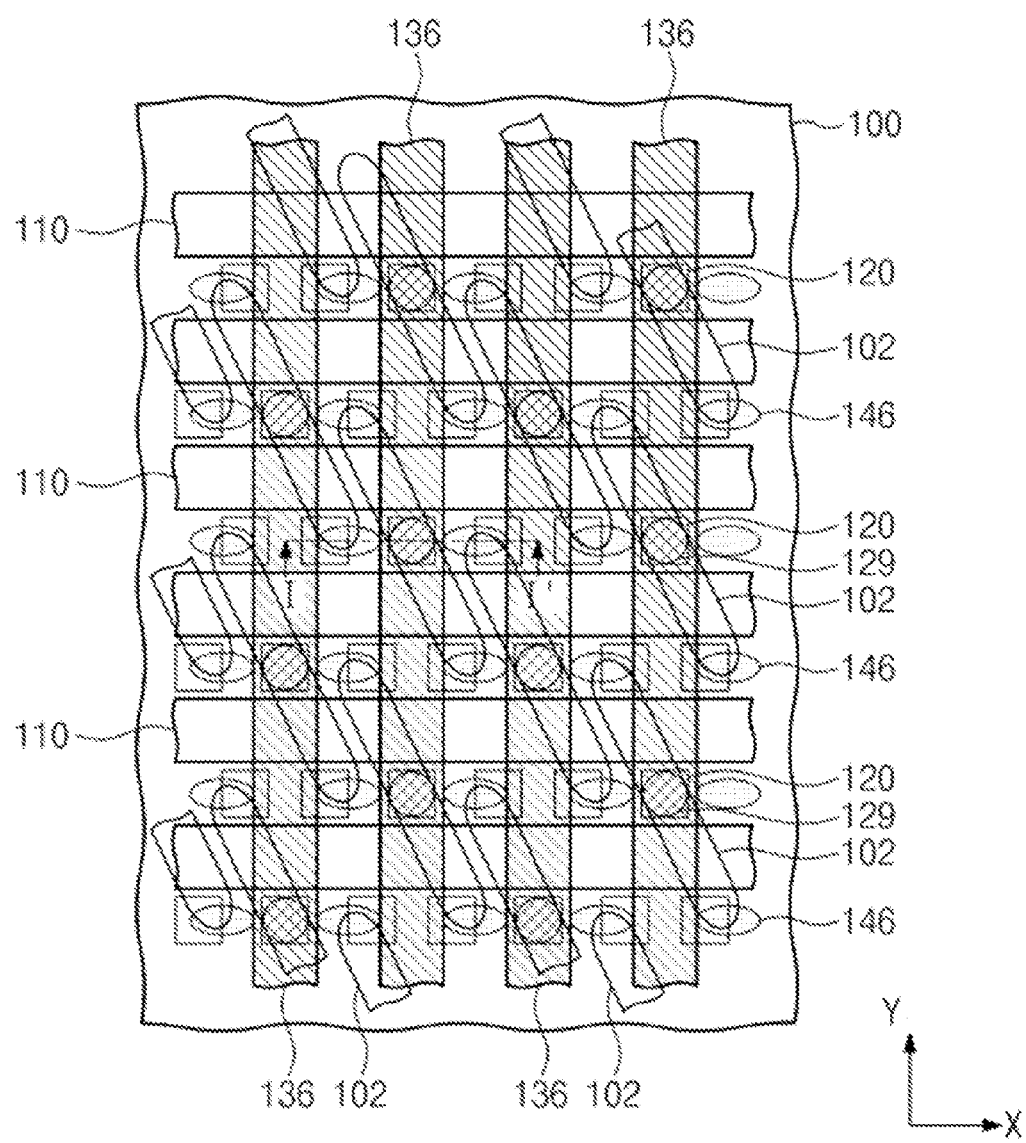

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will be described below in more detail with reference to the accompanying drawings. Example embodiments may, however, be embodied in different forms and should not be constructed as limited to the embodiments set forth herein. Rather, these embodiments are provided so that this disclosure will be thorough and complete, and will fully convey the scope of example embodiments to those skilled in the art.

In the drawings, the thickness of layers and regions may be exaggerated for clarity. It will also be understood that when an element, e.g., a layer, region or substrate is referred to as being "on" or "onto" another element, it may lie directly on the other element or intervening elements or layers may also be present. Like reference numerals refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
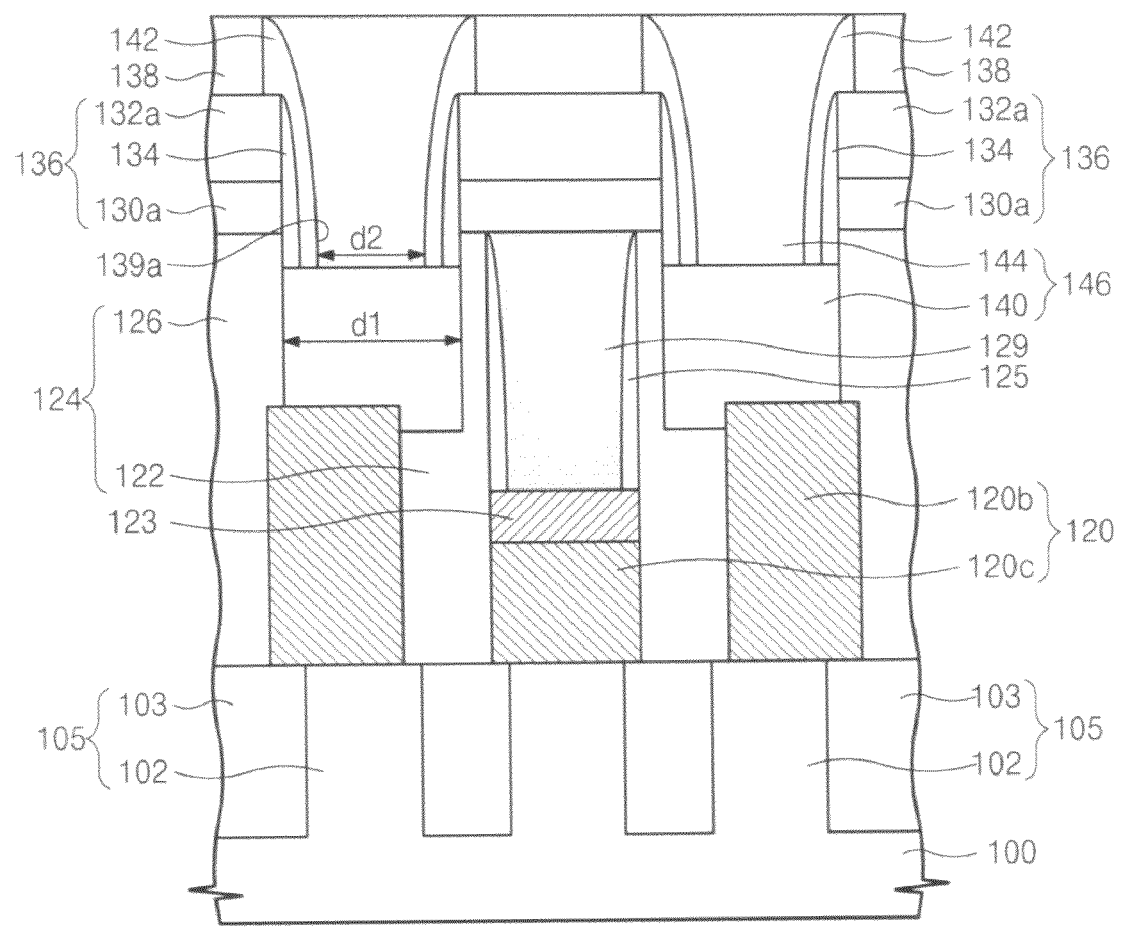

FIG. 1 is a top plan view of a cell region of a memory device in accordance with example embodiments. FIG. 2 is a cross sectional view taken along the line I-I' of FIG. 1 in accordance with example embodiments. Referring to FIGS. 1 and 2, a semiconductor memory device according to example embodiments will be described.

A device isolation layer 103 may be formed in a semiconductor substrate 100 to define an active region 102. The active region 102 may include a region where a cell transistor is disposed. The active region 102 may have an oval shape on a top plan view. A structure of the active region may be a 6 $F^2$. For example, an angle between a Y axis and a major axis of the active region may be about 24 to about 27 degrees. The angle may vary in variety according to a cell structure. Two word lines 110 may be disposed to go across the one active region 102. A lower structure 105 may include the active region 102, the device isolation layer 103 and the word line 110.

A bit line contact pad 120c and a buried contact pad 120b may be disposed on the lower structure 105. A contact pad 120 may include the bit line contact pad 120c and the buried contact pad 120b. The bit line contact pad 120c may be electrically connected to a center of the active region 102 and the buried contact pad 120b may be electrically connected to an edge of the active region 102. The bit line contact pad 120c may be recessed, so that a top surface of the bit line contact pad 120c may be lower than a top surface of the buried contact pad 120b.

A bit line contact plug 129 may be disposed on the bit line contact pad 120c. The bit line contact plug 129 may be a polysilicon plug or a tungsten plug. A metal silicide 123 may be disposed between the bit line contact pad 120c and the bit line contact plug 129. The metal silicide 123 may reduce a contact resistance between the bit line contact pad 120c and the bit line contact plug 129. A center of the bit line contact pad 120c may be aligned with a center of the bit line contact plug 129.

A top surface of the bit line contact plug 129 may be electrically connected to a bit line 136 that extends in a Y direction. The bit line 136 may include a bit line conductive pattern 130a, a bit line hard mask pattern 132a and a bit line spacer 134. The bit line conductive pattern 130a may be tungsten. The bit line hard mask pattern 132a may be a silicon nitride layer. The bit line spacer 134 may be a silicon nitride layer.

At least one buried contact plug 146 may be disposed on the buried contact pad 120b. A center of the buried contact pad 120b may not be aligned with a center of the at least one buried contact plug 146. For example, a central axis of the at least one buried contact plug 146 may be offset from a central axis of the buried contact pad 120b on a plane parallel to a top surface of the semiconductor substrate. The at least one buried contact plug 146 may include a first buried contact plug 140 and a second buried contact plug 144 disposed on the first buried contact plug 140 and filling an expanded buried contact hole 139a. A width (d1) of a bottom surface of the first buried contact plug 140 may be greater than the smallest width (d2) of the second buried contact plug 144. A bottom surface of the second buried contact plug 144 may be lower than a bottom surface of the bit line 136. A metal silicide (not shown) may be interposed between the first buried contact plug 140 and the second buried contact plug 144. The buried contact plug 146 may be electrically connected to a capacitor.

A first interlayer insulating layer 124 may include a first lower insulating layer 122 filling a space between the buried contact pad 120b and the bit line contact pad 120c, and a first upper insulating layer 126 disposed on the buried contact pad 120b and the bit line contact pad 120c. The first interlayer insulating layer 124 may be a silicon oxide layer. The bit line 136 may be provided on the first interlayer insulating layer 124. A top surface of the first interlayer insulating layer 124 may be the same height as a top surface of the bit line contact plug 129. A second interlayer insulating layer 138 may be formed on the semiconductor substrate 100 including the bit line 136.

A bit line contact spacer 125 may be disposed between the first interlayer insulating layer 124 and the bit line contact plug 129. The bit line contact spacer 125 may help to prevent or reduce an electrical short between the first interlayer insulating layer 124 and the bit line contact plug 129. The bit line contact spacer 125 may be a silicon nitride layer. The bit line spacer 134 may be disposed on side surfaces of the bit line conductive pattern 130a and the bit line hard mask pattern 132a. The bit line spacer 134 may help to prevent or reduce an electrical short between the buried contact plug 146 and the bit line conductive pattern 130a. The bit line spacer 134 may include at least one of a silicon nitride layer and a silicon oxynitride layer. A bottom surface of the bit line spacer 134 may be lower than a bottom surface of the bit line conductive pattern 130a. A buried contact spacer 142 may be disposed between the bit line spacer 134 and the buried contact plug 146. The buried contact spacer 142 may help to prevent or reduce a dielectric breakdown between the buried contact plug 146 and the bit line conductive pattern 130a. The buried contact spacer 142 may include at least one of a silicon nitride layer and a silicon oxynitride layer. A bottom surface of the buried contact spacer 142 may be lower than a bottom surface of the bit line conductive pattern 130a. The bottom surface of the bit line spacer 134 may be even with the bottom surface of the buried contact spacer 142. The bottom surfaces of the buried contact spacer 142 and the bit line spacer 134 may be even with a top surface of the first buried contact plug 140.

Figure 3:
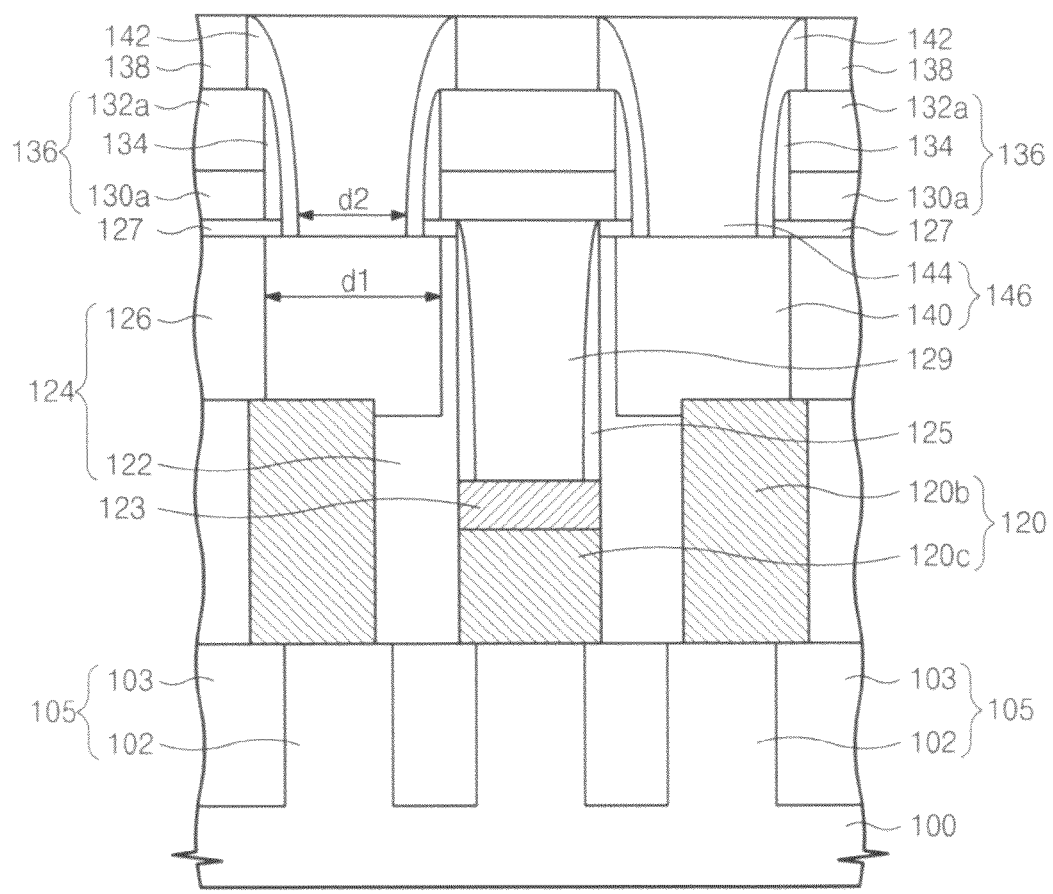

Referring to FIGS. 1 and 3, a memory device in accordance with example embodiments will be described. Aforementioned descriptions may be omitted. An etch stop layer 127 may be provided between a bit line 136 and a first interlayer insulating layer 124. The etch stop layer 127 may help to prevent or reduce an electrical short between a bit line conductive pattern 130a and a buried contact plug 146. The etch stop layer 127 may include at least one of a silicon nitride layer and a silicon oxynitride layer. A side surface of the etch stop layer 127 may be aligned with a bit line spacer 134. According to example embodiments, the etch stop layer 127 may be aligned with the bit line conductive pattern 130a. A buried contact spacer 142 may be disposed between a second buried contact plug 144 and the bit line spacer 134. A bottom surface of the etch stop layer 127 may be even with a bottom surface of the buried contact spacer 142.

Figure 4:
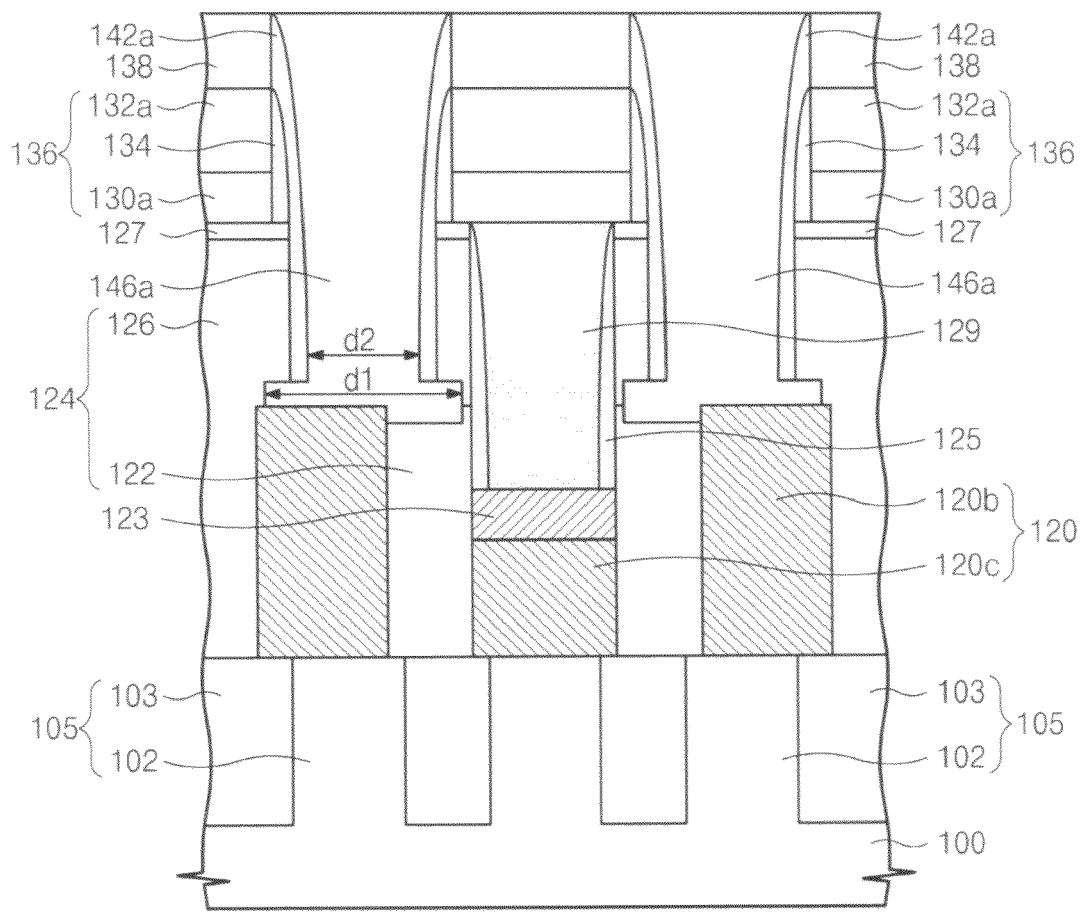

Referring to FIGS. 1 and 4, a memory device in accordance with example embodiments will be described. Aforementioned descriptions may be omitted. A buried contact plug 146a may include a first part adjacent to a buried contact pad 120b and a second part adjacent to a bit line conductive pattern 130a. A width (d1) of the first part may be greater than a width (d2) of the second part. A buried contact spacer 142a may be disposed between the buried contact plug 146a and the bit line conductive pattern 130a. A bottom surface of the buried contact spacer 142a may be even with an interface between the first part and the second part. The first part may laterally extend to have a protrusion located under the buried contact spacer 142a.

The buried contact spacer 142a may not be in contact with the buried contact pad 120b. The bottom surface of the buried contact spacer 142a may be lower than a bottom surface of the bit line 136. Accordingly, a dielectric breakdown between the bit line conductive pattern 130a and the buried contact plug 146a may be prevented or reduced. The buried contact spacer 142a may help to prevent or reduce a dielectric breakdown and an electrical short between the bit line conductive pattern 130a and the buried contact plug 146a. Also, in expanding a buried contact hole that will be described later, a top surface of the buried contact pad 120b and a first interlayer insulating layer 124 may be locally removed. A bit line spacer 134 may be disposed between the bit line 136 and the buried contact plug 146a. The bit line spacer 134 may be disposed on an etch stop layer. According to example embodiments, the etch stop layer 127 may be removed.

Figure 5A:
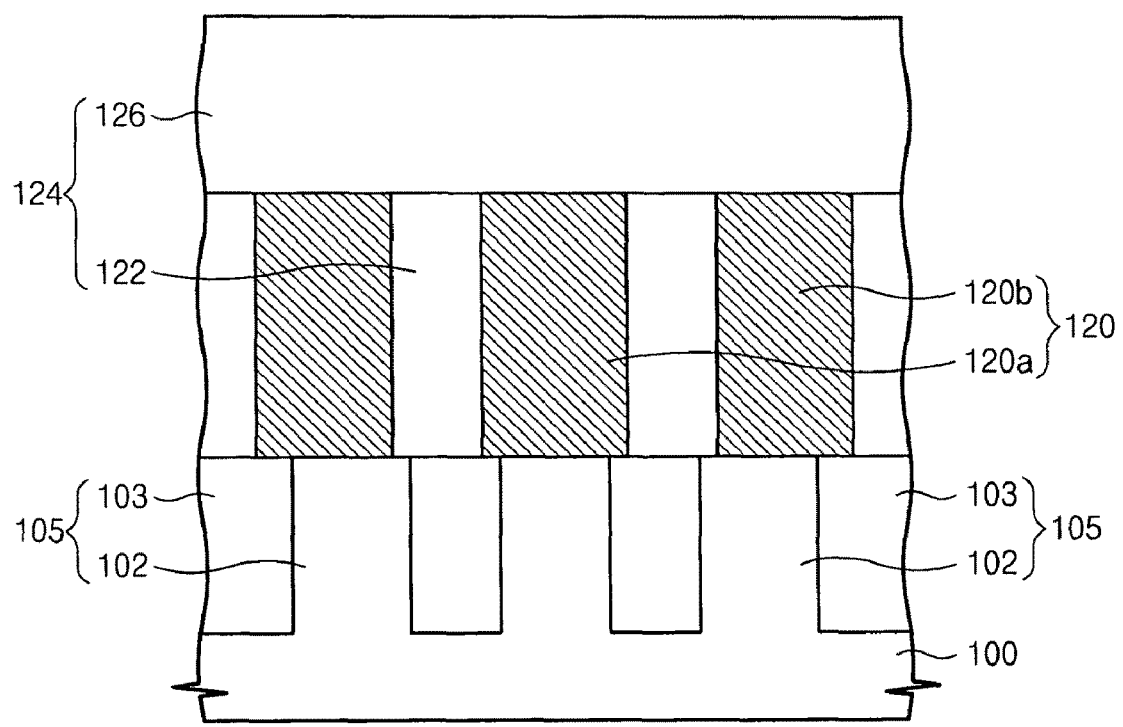
FIGS. 5a through 5j are cross sectional views taken along the line I-I' of FIG. 1 illustrating a method of forming a memory device in accordance with example embodiments.

FIGS. 5a through 5j are cross sectional views taken along the line I-I' of FIG. 1 illustrating a method of forming a memory device in accordance with example embodiments. Referring to FIGS. 1 and 5a, the active region 102 may be divided into two source regions and one drain region by the word line 110. More specifically, the source regions may be disposed on both ends of the active region 102 and the drain region may be disposed on a center of the active region 102. The lower structure 105 may be disposed on a lower portion and a side surface of a bit line contact pad 120c and a buried contact pad 120b, and may include the word line 110, the active region 102 and the device isolation layer 103.

The buried contact pad 120b may be disposed on the source region and the bit line contact pad 120c may be disposed on the drain region. The bit line contact pad 120c and the buried contact pad 120b may be simultaneously formed. The bit line contact pad 120c and the buried contact pad 120b may be doped polysilicon. A space between the bit line contact pad 120a and the buried contact pad 120b may be filled with a first lower insulating layer 122. A first interlayer insulating layer 124 may include the first lower insulating layer 122 and a first upper insulating layer 126 formed on the bit line contact pad 120c and the buried contact pad 120b. The first interlayer insulating layer 124 may be a silicon oxide layer.

The first lower insulating layer 122 may be formed on the semiconductor substrate 100 including the word line 110. The first lower insulating layer 122 may be patterned to form a contact pad hole. The contact pad hole may be filled with a conductive material. The conductive material may be planarized to form the bit line contact pad 120c and the buried contact pad 120b. A first upper insulating layer 126 may be formed on the bit line contact pad 120a and the buried contact pad 120b. The first upper insulating layer 126 may be planarized to form the first interlayer insulating layer 124.

Figure 5B:
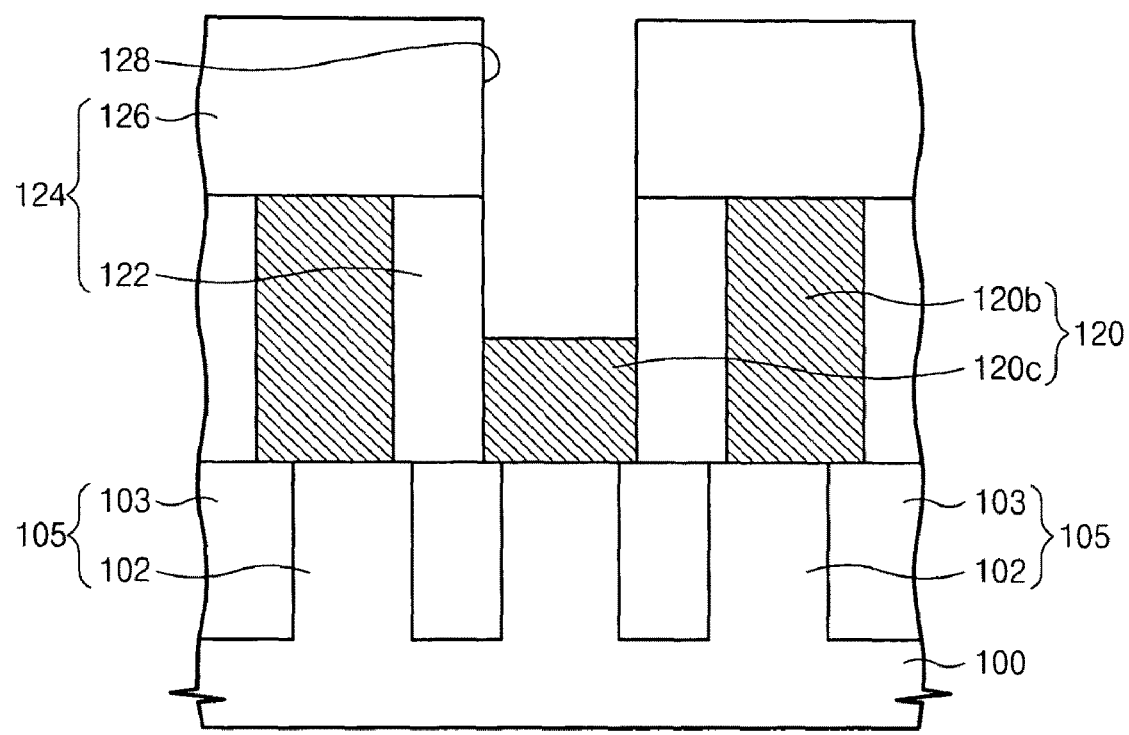

Referring to FIG. 5b, a bit line contact mask pattern (not shown) may be formed on the semiconductor substrate 100. The first interlayer insulating layer 124 may be etched using the bit line contact mask pattern as an etch mask down to a top surface of the bit line contact pad 120a to form a bit line contact hole 128. Subsequently, the exposed bit line contact pad 120a may be selectively etched. Thus, the bit line contact pad may be recessed to form a recessed bit line contact pad 120c having a top surface lower than the buried contact pad 120b. For example, the bit line contact hole 128 may become a recessed bit line contact hole. The selective etching may be a wet etching or a dry etching. The first interlayer insulating layer 124 may not be etched.

Figure 5C:
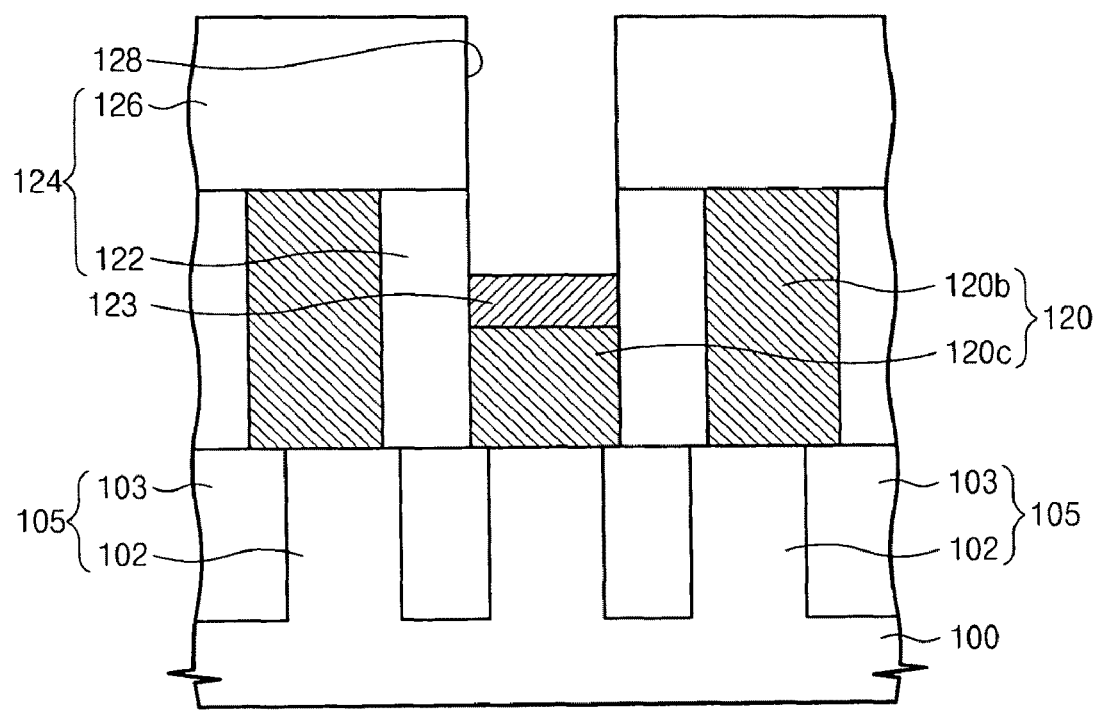

Referring to FIG. 5c, a metal silicide 123 may be formed on the recessed bit line contact pad 120c. For example, metal may be deposited on the semiconductor substrate 100. The metal may react to the recessed bit line contact pad 120c by an annealing process to form the metal silicide 123. The metal on a region where the metal silicide is not formed may be selectively etched and removed. Thus, the metal silicide may be formed on the recessed bit line cont pad 120c. The metal silicide may include at least one of titanium silicide (TiSix), cobalt silicide (CoSix) and tungsten silicide (WSix). The metal silicide may reduce contact resistances between the bit line contact pad 120c and a bit line contact plug (not shown) that will be described later.

Figure 5D:
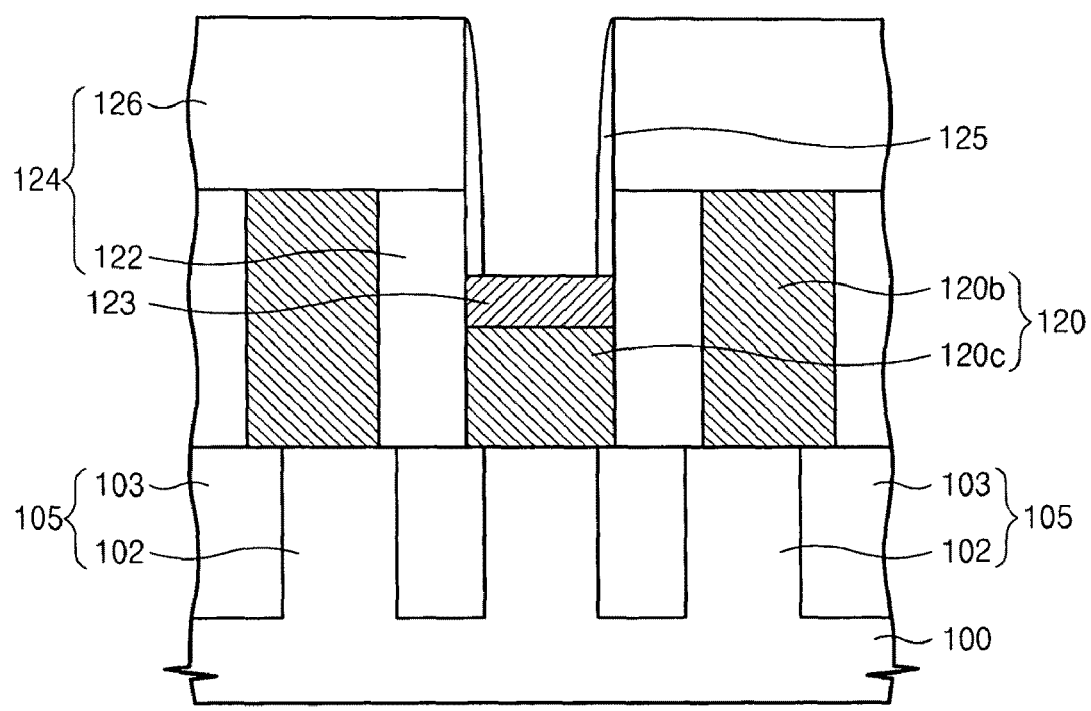

Referring to FIG. 5d, a bit line contact spacer layer may be formed on the semiconductor substrate 100 including the recessed bit line contact hole 128. The recessed bit line contact hole 128 may be conformally covered with the bit line contact spacer layer. The bit line contact spacer layer may include at least one of a silicon nitride layer and a silicon oxynitride layer. The bit line contact spacer layer may be anisotropically etched to form a bit line contact spacer 125. The bit line contact spacer layer 125 may be disposed on a side surface of the recessed bit line contact hole 128. The bit line contact spacer layer 125 may help to prevent or reduce an electrical contact between a buried contact plug 146 and a bit line contact plug 129.

Figure 5E:
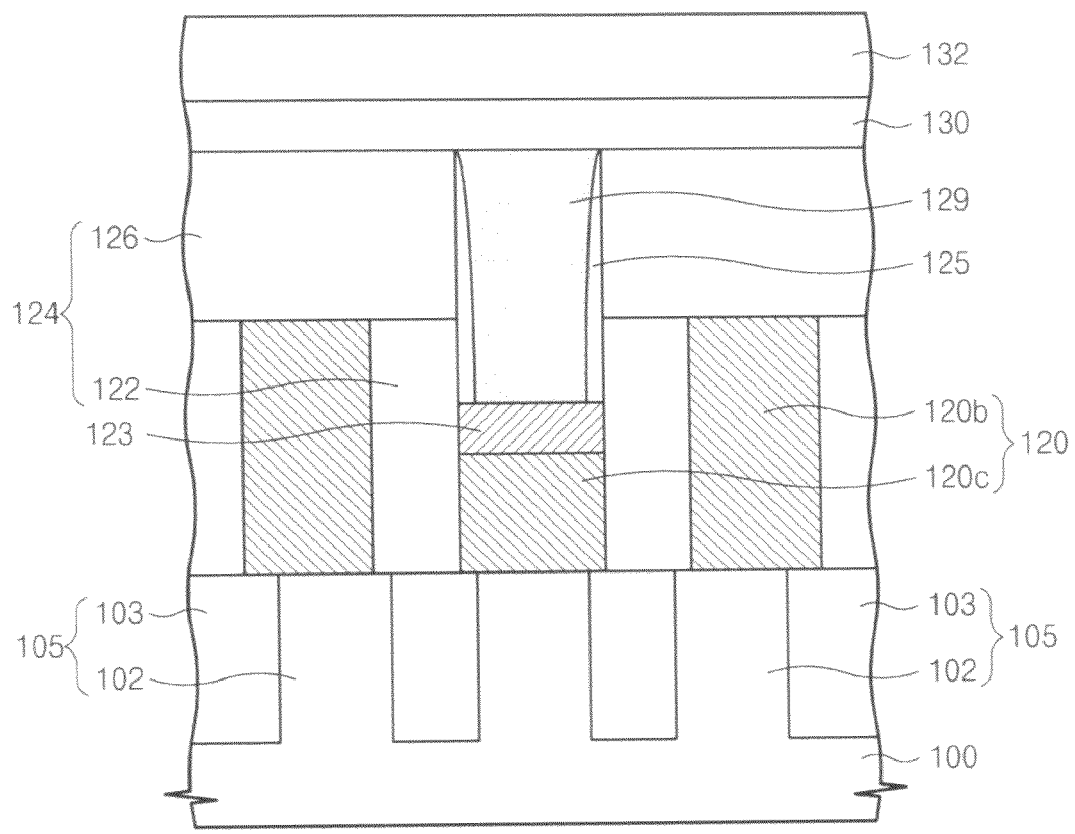

Referring to FIG. 5e, conductive material may be deposited on the semiconductor substrate 100 including the bit line contact spacer 125. The conductive material may fill the recessed bit line contact hole 128. The conductive material may include at least one of tungsten and polysilicon. For example, the conductive material may have a multilayer structure of Ti/TiN/W. The Ti/TiN may be a diffusion barrier metal. The conductive material may be planarized to form the bit line contact plug 129. The planarization may be performed using an etch back process or a chemical mechanical polishing (CMP). According to example embodiments, the bit line contact spacer 125 may not be formed. In example embodiments, in a process of expanding the buried contact hole, the bit line contact plug 129 may not be exposed.

A bit line conductive layer 130 and a bit line hard mask layer 132 may be formed on the semiconductor substrate 100 including the bit line contact plug 129. For example, the bit line conductive layer 130 may be a multilayer of Ti/TiN/W. The bit line hard mask layer 132 may include at least one of a silicon nitride layer and a silicon oxynitride layer.

Figure 5F:
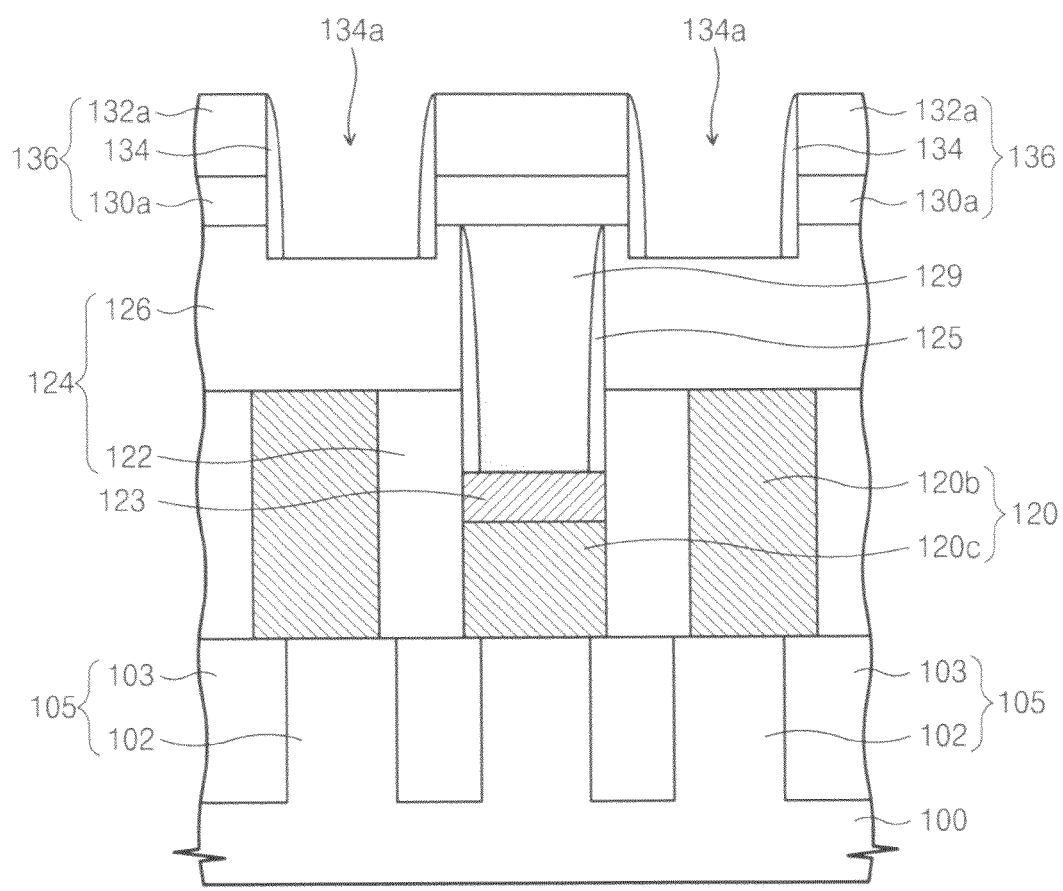

Referring to FIG. 5f, the bit line hard mask layer 132 and the bit line conductive layer 130 may be patterned to form a hard mask pattern 132a and a bit line conductive pattern 130a. A top surface of the first interlayer insulating layer 124 may be partly etched between the bit line conductive patterns 130a to form preliminary buried contact holes 134a. A bit line spacer 134 may be disposed between a buried contact plug (not shown) and the bit line conductive pattern 130a to electrically disconnect the buried contact plug (not shown) from the bit line conductive pattern 130a.

A bit line spacer layer (not shown) may be formed on the semiconductor substrate 100 including the bit line conductive pattern 130a. The bit line spacer layer may be anisotropically etched to form a bit line spacer 134. The bit line spacer layer may include at least one of a silicon nitride layer and a silicon oxynitride layer. A bit line 136 may include the bit line conductive pattern 130a and the bit line hard mask pattern 132a.

Figure 5G:
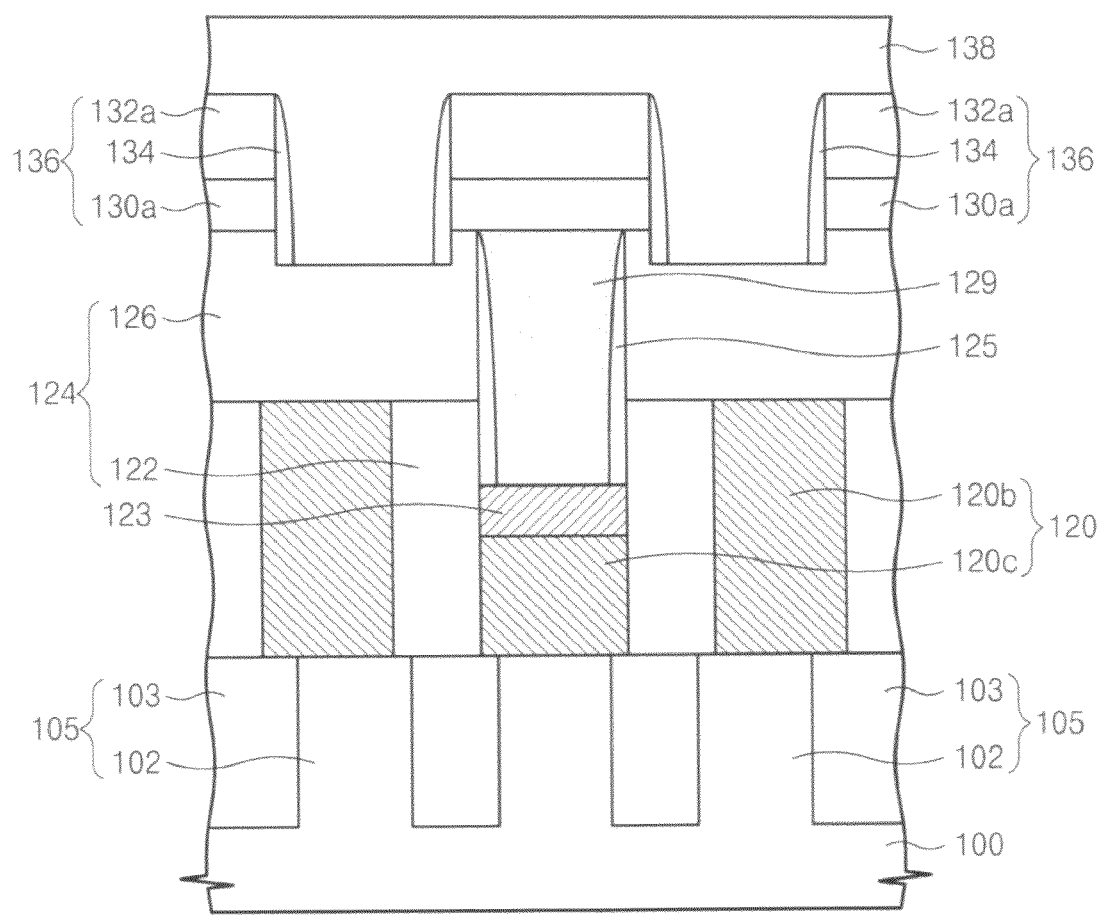

Referring to FIG. 5g, a second interlayer insulating layer 138 may be formed on the semiconductor substrate 100 including the bit line 136. The second interlayer insulating layer 138 may be a silicon oxide layer. The second interlayer insulating layer 138 may be planarized. A space between the bit lines 136 may be filled with the second interlayer insulating layer 138, and the second interlayer insulating layer 138 may be formed using a HDP CVD process. An annealing process may be accompanied after forming the second interlayer insulating layer 138.

Figure 5H:
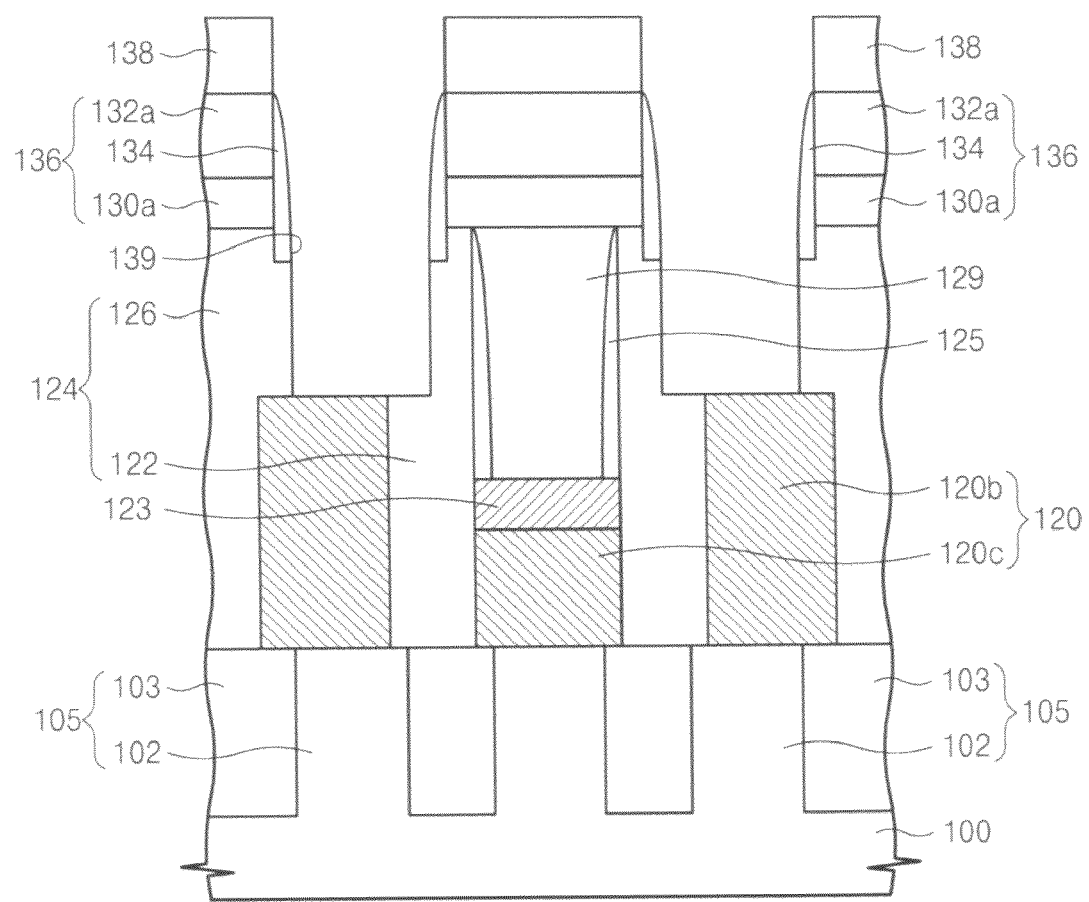

Referring to FIG. 5h, a buried contact mask pattern (not shown) may be formed on the semiconductor substrate 100 including the second interlayer insulating layer 138. The second interlayer insulating layer 138 and the first interlayer insulating layer 124 may be etched using the buried contact mask pattern as an etch mask down to a top surface of the buried contact pad 120b to form a buried contact hole 139. Forming the buried contact hole 139 may include etching the first and second interlayer insulating layers 124 and 138 through an etching method having an etch selectivity with respect to the bit line hard mask pattern 132a and the bit line spacer 134. The buried contact hole 139 may be self aligned by the bit line hard mask pattern 132a and the bit line spacer 134.

Figure 5I:
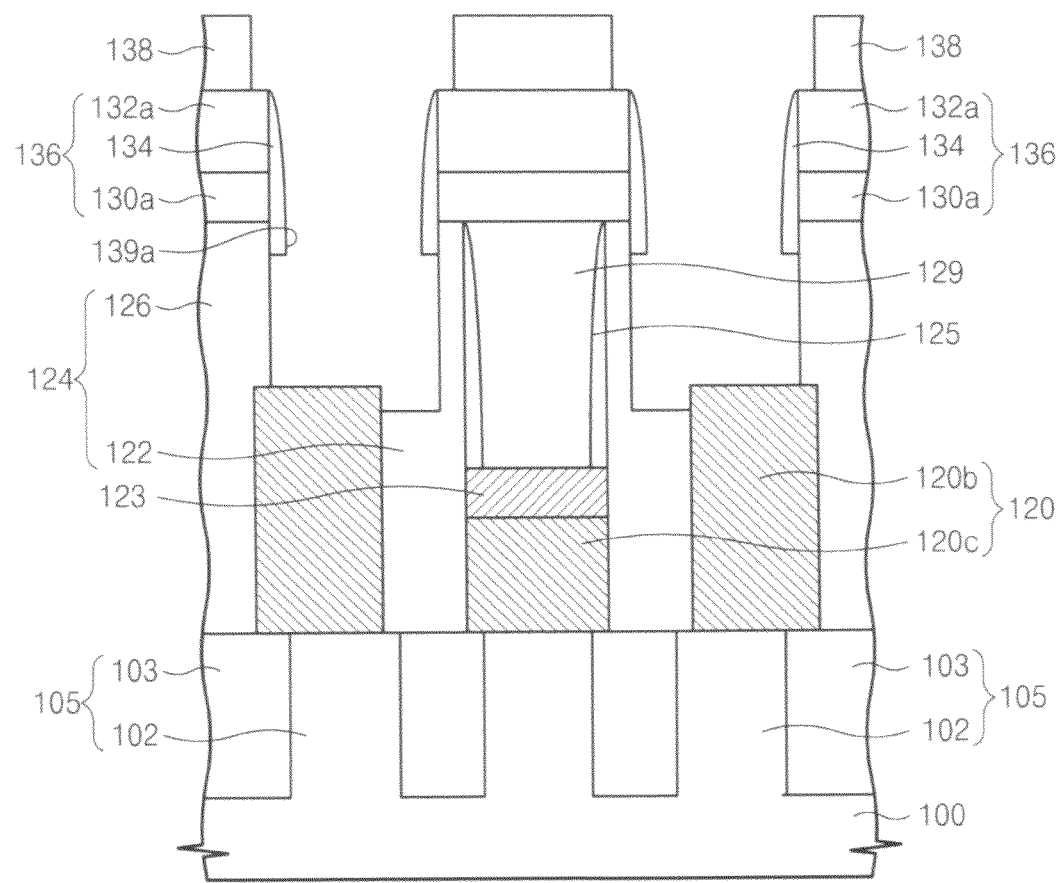

Referring to FIG. 5i, the buried contact hole 139 located under the bit line spacer 134 may be expanded by wet or dry etching the semiconductor substrate 100 including the buried contact hole 139. Thus, a width of a bottom surface of the expanded buried contact hole 139a may be greater than a width of a region where a bottom surface of the bit line contact spacer 134 may be located. Accordingly, the expanded buried contact hole 139a may be formed. Forming the expanded buried contact hole 139a may include etching the first and second interlayer insulating layers 124 and 138 through an etching method having an etching selectivity with respect to the buried contact pad 120b and the bit line spacer 134. The etching may be an isotropic etching. The first interlayer insulating layer 124 may remain between the bit line conductive pattern 130a and a buried contact plug to electrically disconnect the bit line conductive pattern 130a from the buried contact plug. A portion of a side surface and a top surface of the buried contact pad 120b may be further exposed by the etching. The bit line conductive pattern 130a, the bit line contact plug 129 and the bit line contact spacer 125 may not be exposed by the etching. The first interlayer insulating layer 124 disposed on a top surface and an upper side surface of the buried contact pad 120b may be removed. Expanding the buried contact hole may increase a contact area between the buried contact pad 120b and the buried contact plug (not shown). As a result, a contact resistance between the buried contact pad 120b and the buried contact plug (not shown) may be reduced. Expanding the buried contact hole may be of advantage in the case of DRAM cell having a structure where the buried contact plug (not shown) may be misaligned with the buried contact pad 120b.

Figure 5J:
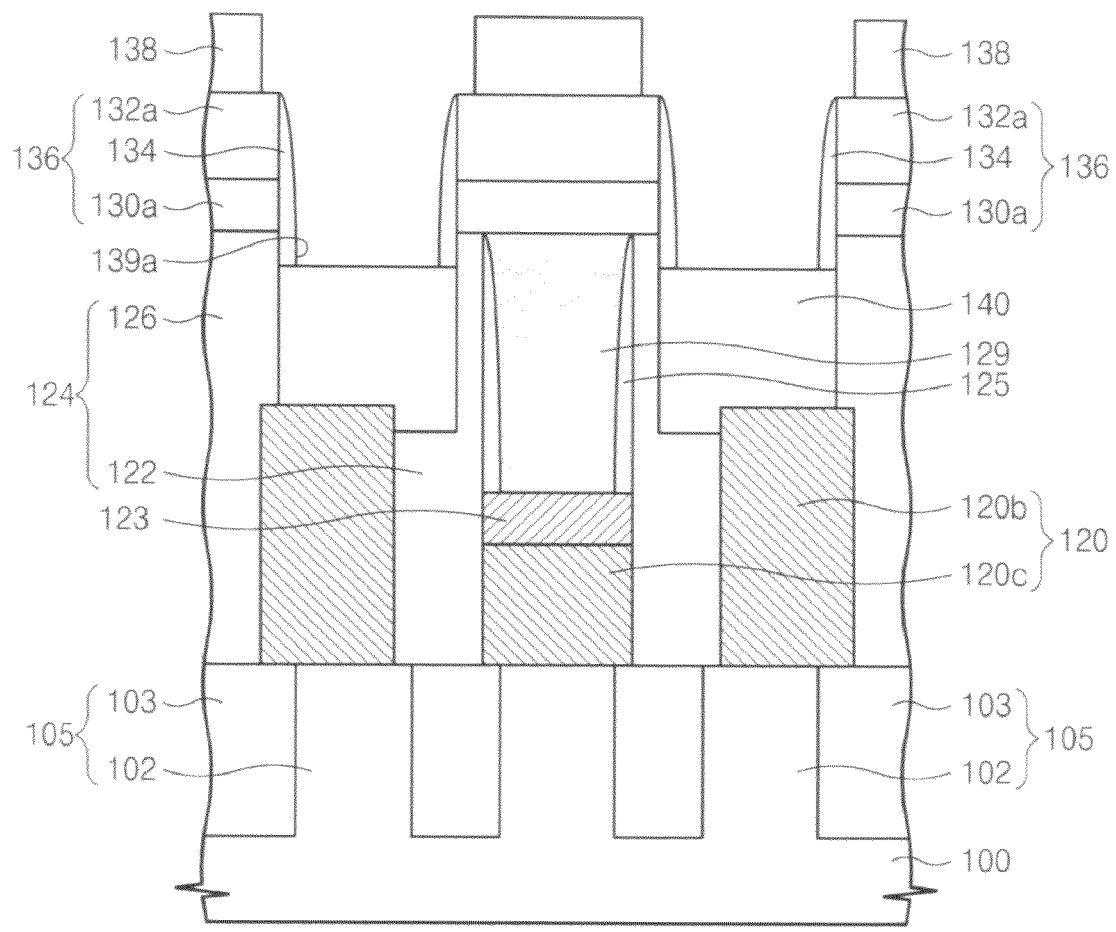

Referring to FIG. 5j, a conductive material filling the expanded buried contact hole 139a may be formed on the semiconductor substrate 100. The conductive material may include at least one of polysilicon and tungsten. In a case of the tungsten, a barrier metal may be further formed in a lower portion of the tungsten. The conductive material may be etched back until the bit line spacer 134 is exposed to form a first buried contact plug 140. The etch-back process may include etching the conductive material using an etching method having an etching selectivity with respect to the second interlayer insulating layer 138. The etch-back process may be a wet etching or a dry etching. The etch-back process may be performed until the bit line spacer 134 is exposed. An increase of a width of the first buried contact plug 140 may increase a contact area between the first buried contact plug 140 and the buried contact pad 120b to reduce a contact resistance between them.

According to example embodiments, a metal silicide may be further formed between the first buried contact plug 140 and the buried contact pad 120b. The metal silicide may reduce a contact resistance between the first buried contact plug 140 and the buried contact pad 120b.

Referring to FIG. 2 again, a buried contact spacer layer may be conformally formed on the semiconductor substrate 100 including the first buried contact plug 140. The buried contact spacer layer may uniformly cover a side surface and a bottom surface of the buried contact hole 139a. The buried contact spacer layer may include at least one of a silicon nitride layer and a silicon oxynitride layer.

Subsequently, the buried contact spacer layer may be anisotropically etched to form the buried contact spacer 142. Conductive material may be deposited to fill the buried contact hole 139a. The conductive material may be planarized to form a second buried contact plug 144. The second buried contact plug 144 may include at least one of polysilicon and tungsten. The planarization may be performed using an etch-back process or a chemical mechanical polishing process. The buried contact spacer 142 may prevent or reduce a dielectric breakdown between the bit line 136 and the second buried contact plug 144. A buried contact plug 146 may include the first and second buried contact plugs 140 and 144. The buried contact plug 146 may include a first part having a first width (d1) and a second part having a second width (d2) formed on the first part. The first width (d1) may be greater than the second width (d2). Thus, a contact area between the buried contact pad 120b and the buried contact plug 146 may increase to reduce a contact resistance between them. The first part having the first width (d1) may be disposed on the first contact plug 140 and the second part having the second width (d2) may be disposed on the second contact plug 144.

According to example embodiments, metal silicide (not shown) may be further formed between the first contact plug 140 and the second contact plug 144. Subsequently, a process of forming a capacitor may be performed.

Figure 6A:
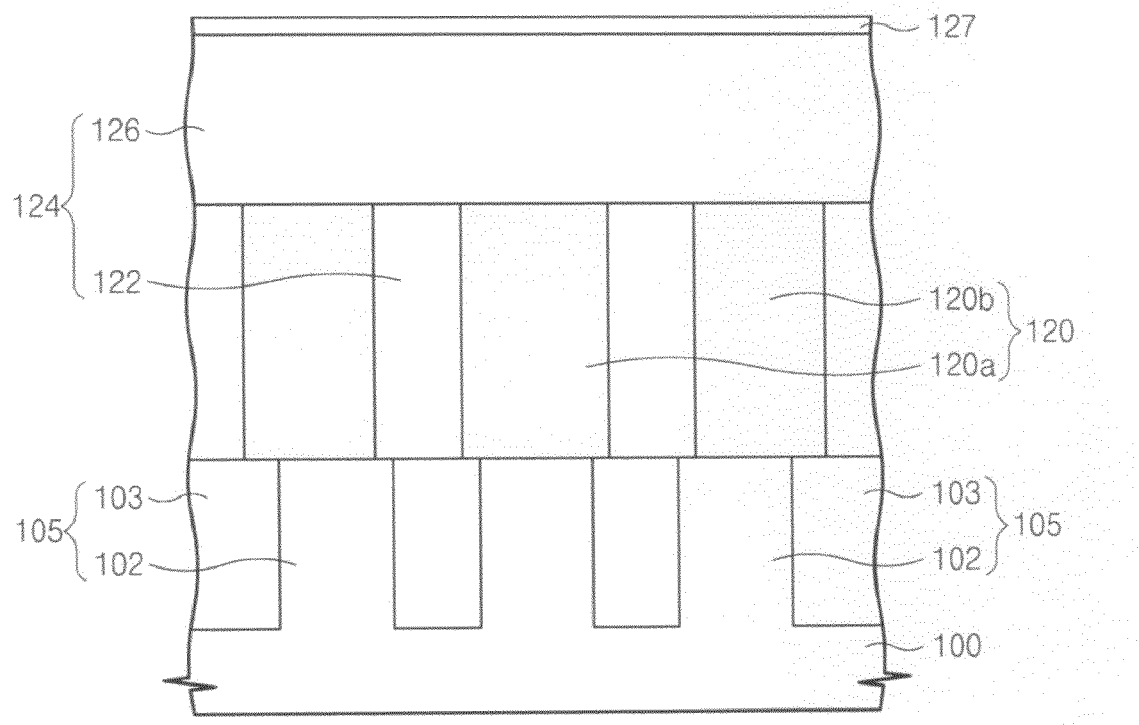
FIGS. 6a through 6i are cross sectional views taken along the line I-I' of FIG. 1 illustrating a method of forming a memory device in accordance with example embodiments.

FIGS. 6a through 6i are cross sectional views taken along the line I-I' of FIG. 1 illustrating a method of forming a memory device in accordance with example embodiments. Referring to FIG. 6a, as described in FIG. 5a, a bit line contact pad 120a and a buried contact pad 120b may be formed on a semiconductor substrate 100. The bit line contact pad 120a and the buried contact pad 120b may be doped polysilicon. An insulating layer may be formed on the bit line contact pad 120a and the buried contact pad 120b and may become a first interlayer insulating layer 124. The first interlayer insulating layer 124 may be a silicon oxide layer. The first interlayer insulating layer 124 may be planarized. The planarization may include at least one of a chemical mechanical polishing (CMP) process, an etch-back process and a reflow process. An etch stop layer 127 may be formed on the first interlayer insulating layer 124. The etch stop layer 127 may have a material different from the first interlayer insulating layer 124. The etch stop layer 127 may include at least one of a silicon nitride layer or a silicon oxynitride layer. The etch stop layer 127 may be a dielectric substance.

Figure 6B:
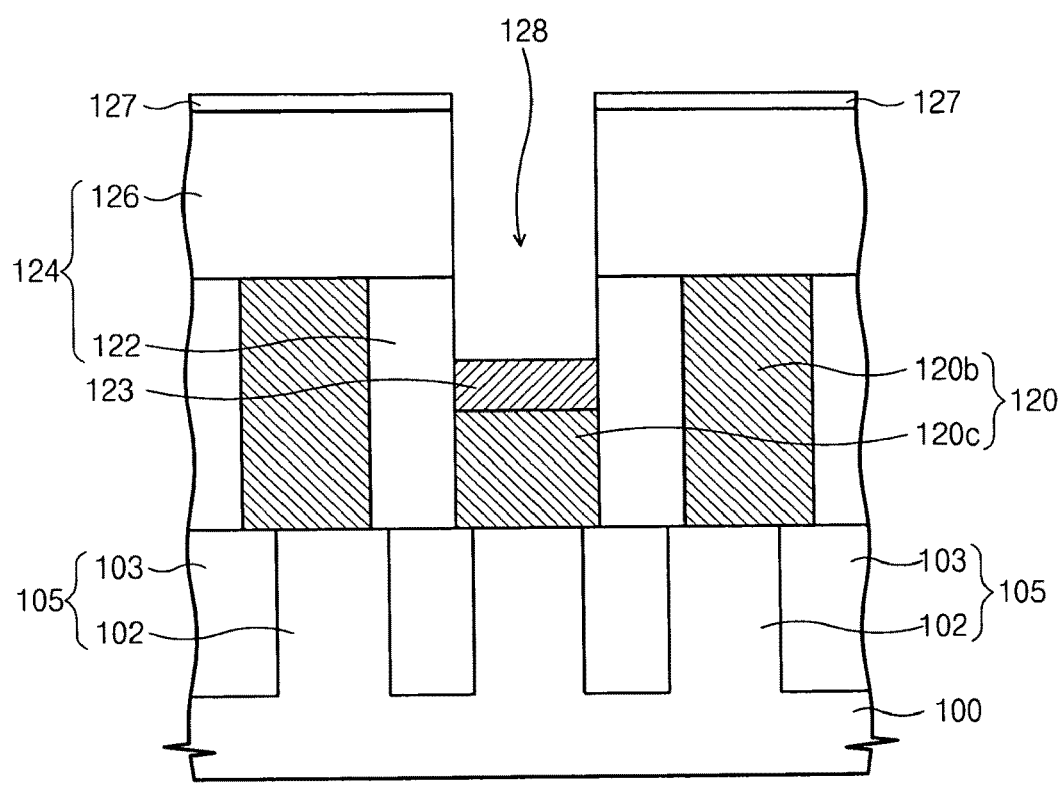

Referring to FIG. 6b, a bit line contact mask pattern may be formed on the semiconductor substrate 100 using a photoresist. The etch stop layer 127 and the first interlayer insulating layer 124 may be etched using the bit line contact mask pattern (not shown) down to a top surface of the bit line contact pad 120a to form a bit line contact hole 128. The bit line contact pad 120a on the semiconductor substrate 100 may be selectively etched. The bit line contact pad 120a may be recessed and may become a recessed bit line contact pad 120c. For example, the bit line contact hole 128 may become a recessed bit line contact hole 128. In a case of the selective etching, the etch stop layer 127 and the first interlayer insulating layer 124 may not be etched. The selective etching may be a wet etching or a dry etching.

A metal silicide 123 may be formed on the recessed bit line contact pad 120c. The metal silicide 123 may include at least one of titanium silicide TiSix, cobalt silicide CoSix, and tungsten silicide WSix. The metal silicide 123 may reduce a contact resistance between the recessed bit line contact pad 120c and a bit line contact plug that will be described later.

Figure 6C:
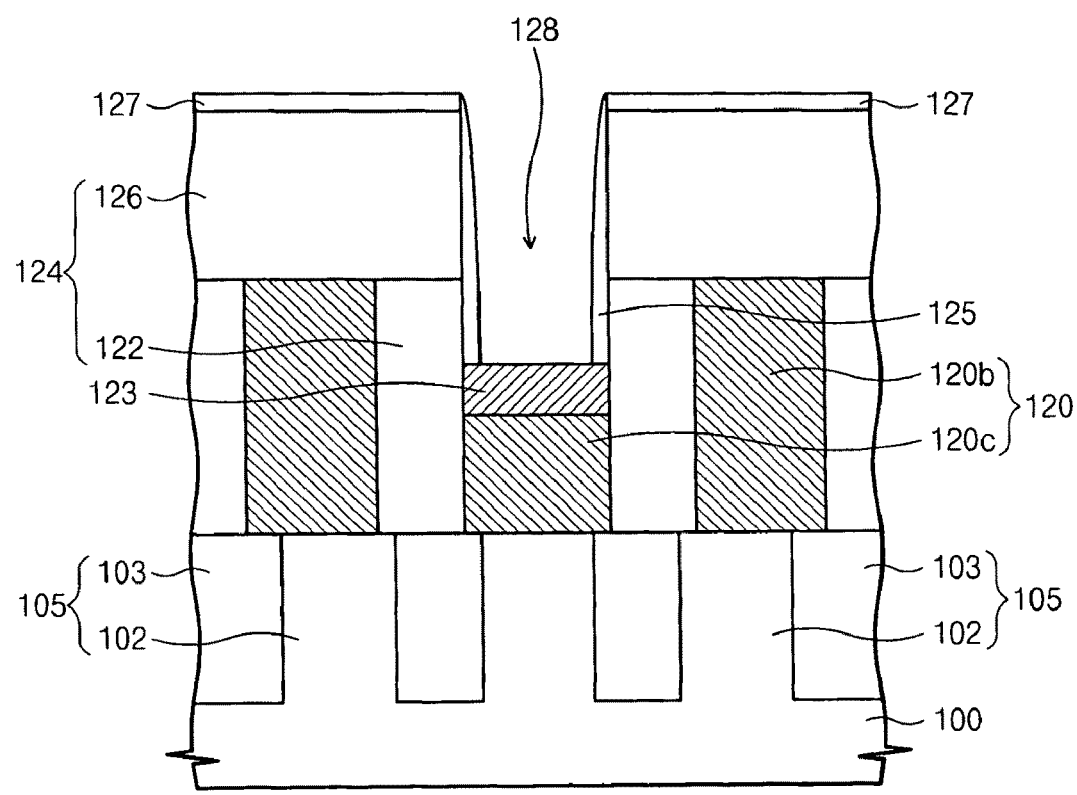

Referring to FIG. 6c, a bit line contact spacer layer may be conformally formed to cover a side surface of the bit line contact hole 128. The bit line contact spacer layer may be anisotropically etched to form a bit line contact spacer 125. The bit line contact spacer 125 may include at least one of a silicon nitride layer and a silicon oxynitride layer. In example embodiments, the etch stop layer 127 may remain on the first interlayer insulating layer 124.

Figure 6D:
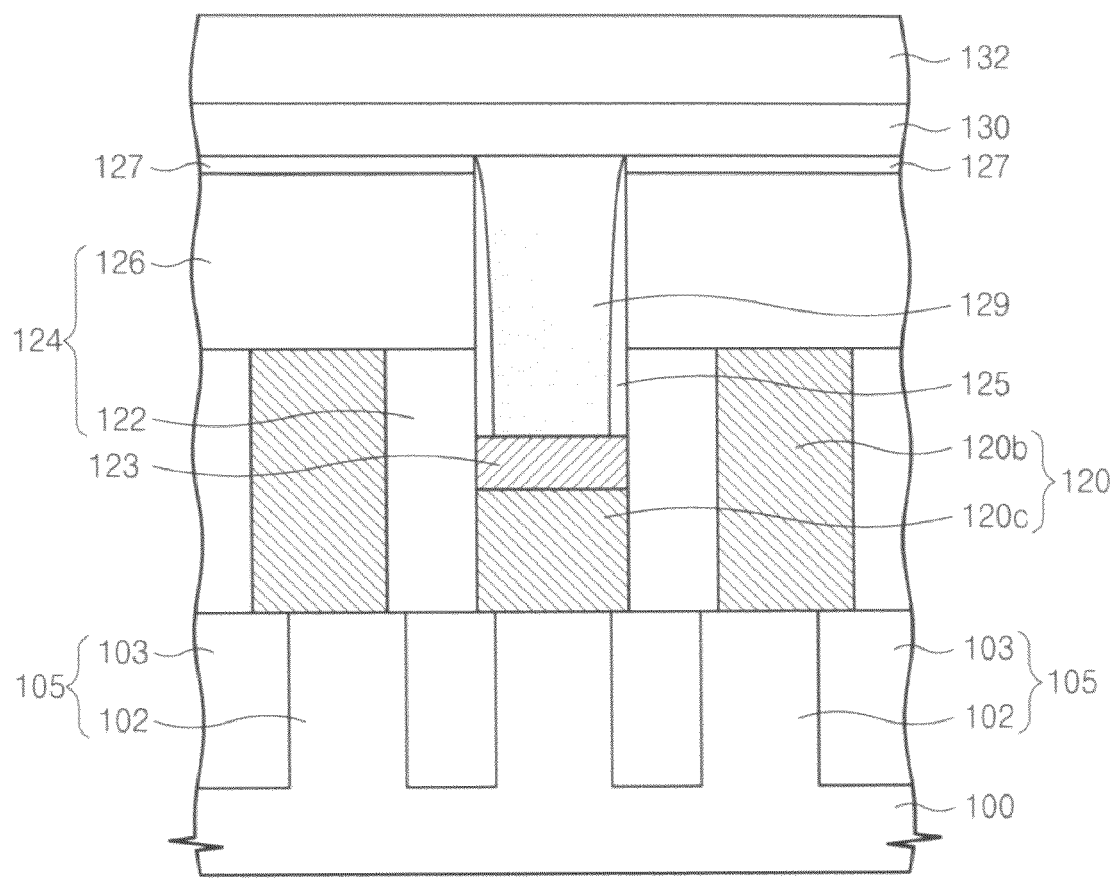

Referring to FIG. 6d, a conductive material may be deposited on the semiconductor substrate 100 including the recessed bit line contact hole 128. The conductive material may fill the recessed bit line contact hole 128. The conductive material may include at least one of polysilicon and tungsten. For example, the conductive material may have a multilayer structure of Ti/TiN/W. A Ti/TiN may be used as a diffusion barrier metal. The conductive material may be planarized to form a bit line contact plug 129. The planarization may be performed using an etch-back process or a chemical mechanical polishing (CMP) process. The Ti/TiN may not be removed during the etch-back process.

A bit line conductive layer 130 and a bit line hard mask layer 132 may be formed on the semiconductor substrate 100 including the bit line contact plug 129. The bit line conductive layer 130 may have a multilayer structure of Ti/TiN/W. The bit line hard mask layer 132 may include at least one of a silicon nitride layer and a silicon oxynitride layer.

Figure 6E:
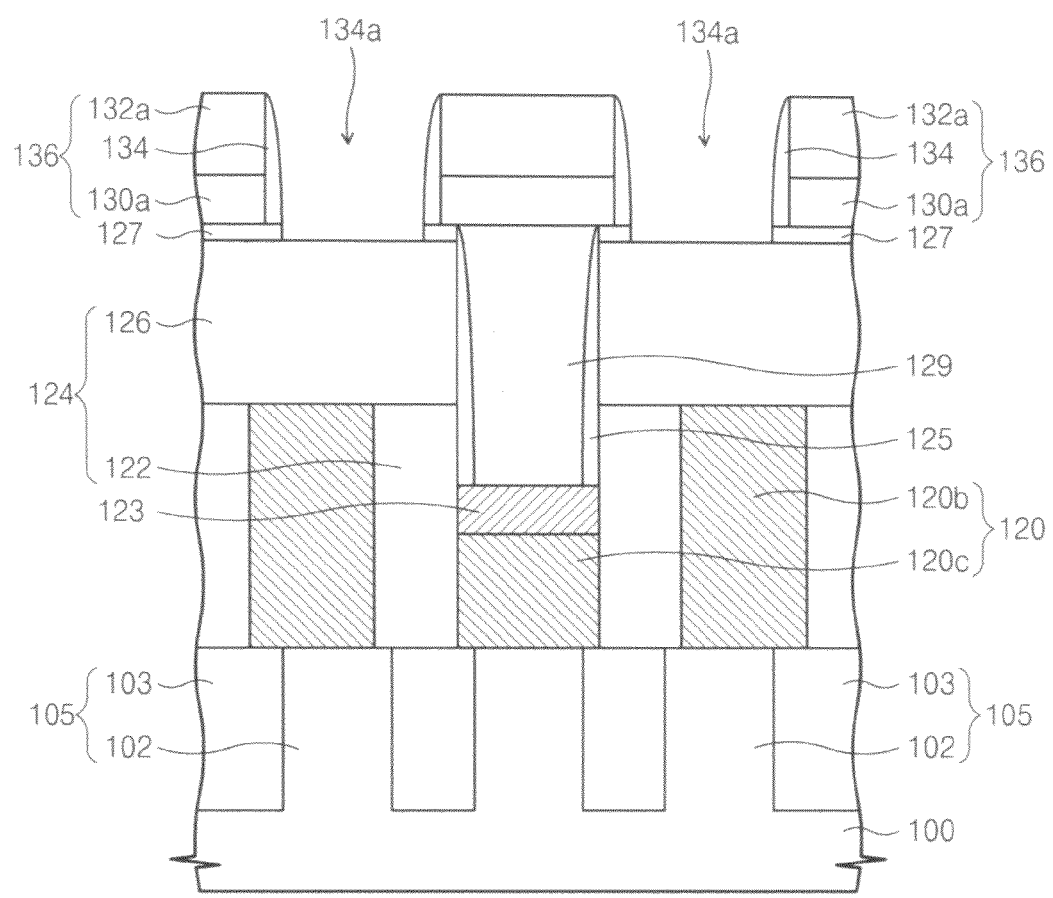

Referring to FIG. 6e, the bit line hard mask layer 132 and the bit line conductive layer 130 may be patterned to form a hard mask pattern 132a and a bit line conductive pattern 130a. A top surface of the first interlayer insulating layer 124 may be partly etched between the bit line conductive patterns 130a to form preliminary buried contact holes 134a.

A bit line spacer layer (not shown) may be formed on the semiconductor substrate 100 including the bit line conductive pattern 130a. The bit line spacer layer may be anisotropically etched to form a bit line spacer 134. The bit line spacer layer may include at least one of a silicon nitride layer and a silicon oxynitride layer. Subsequently, the etch stop layer 127 may be etched. A bit line 136 may include the bit line conductive pattern 130a and the bit line hard mask pattern 132a. According to example embodiments, the bit line conductive pattern 130a and the bit line hard mask pattern 132a may be formed. The etch stop layer 127 may be etched. The first interlayer insulating layer 124 may be in addition partly etched. A bit line spacer layer may be deposited and anisotropically etched to form a bit line spacer 134.

Figure 6F:
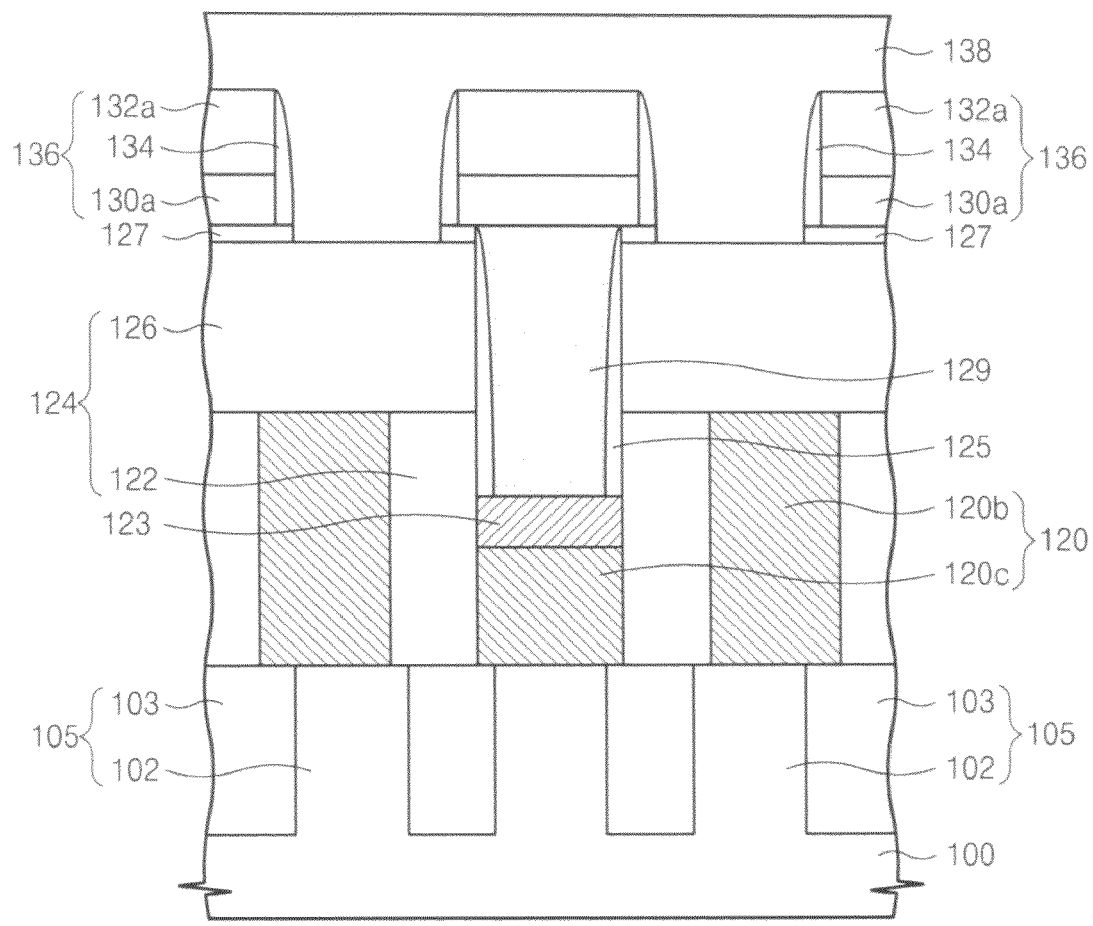

Referring to FIG. 6f, a second interlayer insulating layer 138 may be formed on the semiconductor substrate 100 including the bit line 136. The second interlayer insulating layer 138 may be a silicon layer. The second interlayer insulating layer 138 may be planarized. A space between the bit lines 136 may be filled with the second interlayer insulating layer 138 and the second interlayer insulating layer 138 may be formed using a HDP CVD process. An annealing process may be accompanied.

Figure 6G:
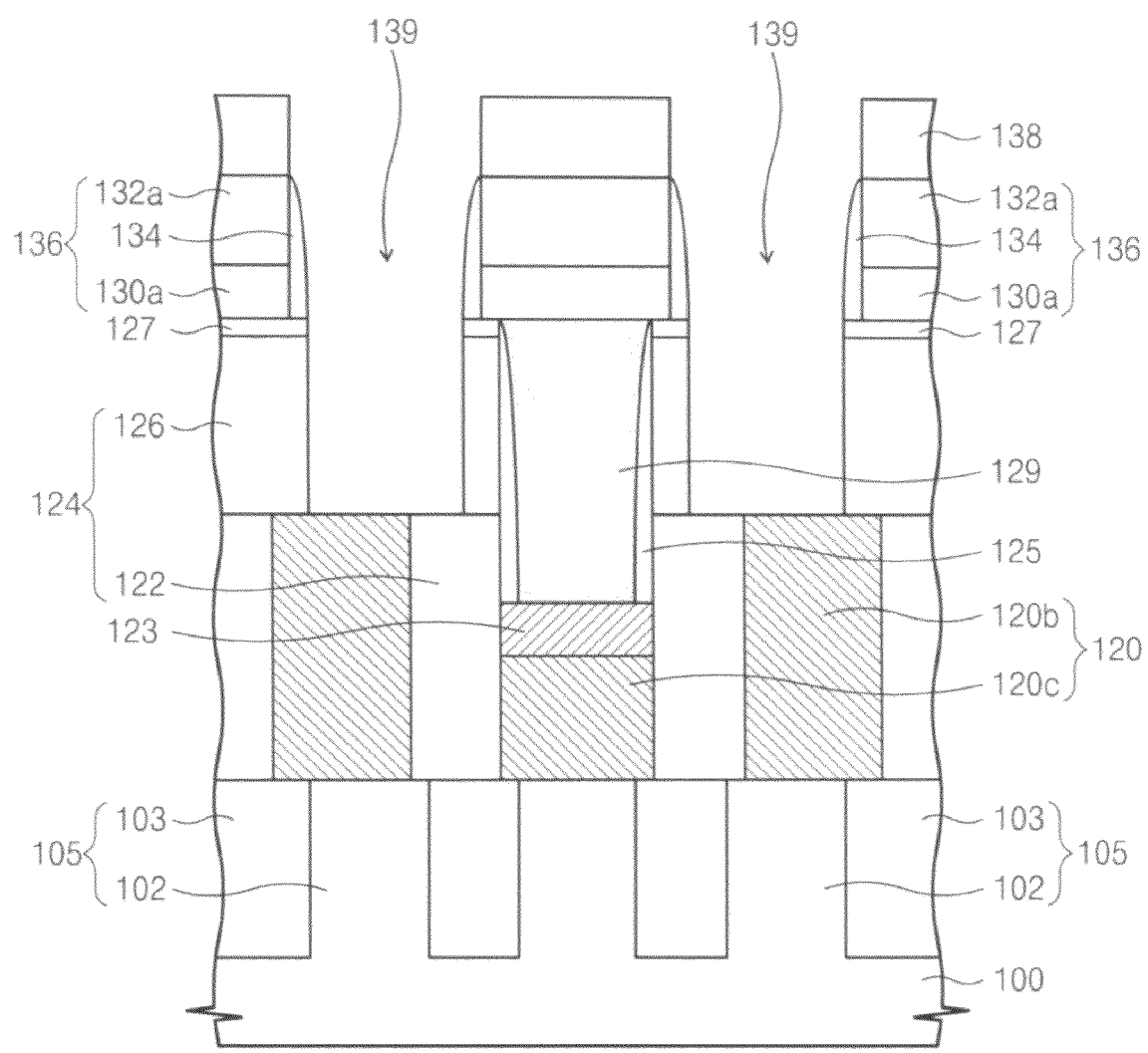

Referring to FIG. 6g, a buried contact mask pattern (not shown) may be formed on the semiconductor substrate 100 including the second interlayer insulating layer 138. The second interlayer insulating layer 138 and the first interlayer insulating layer 124 may be etched using the buried contact mask pattern as an etch mask down to a top surface of the buried contact pad 120b. As a result, a buried contact hole 139 may be formed. The bit line hard mask pattern 132a and the bit line spacer 134 may be somewhat etched and the second interlayer insulating layer 138 and the first interlayer insulating layer 124 may be etched a lot.

Figure 6H:
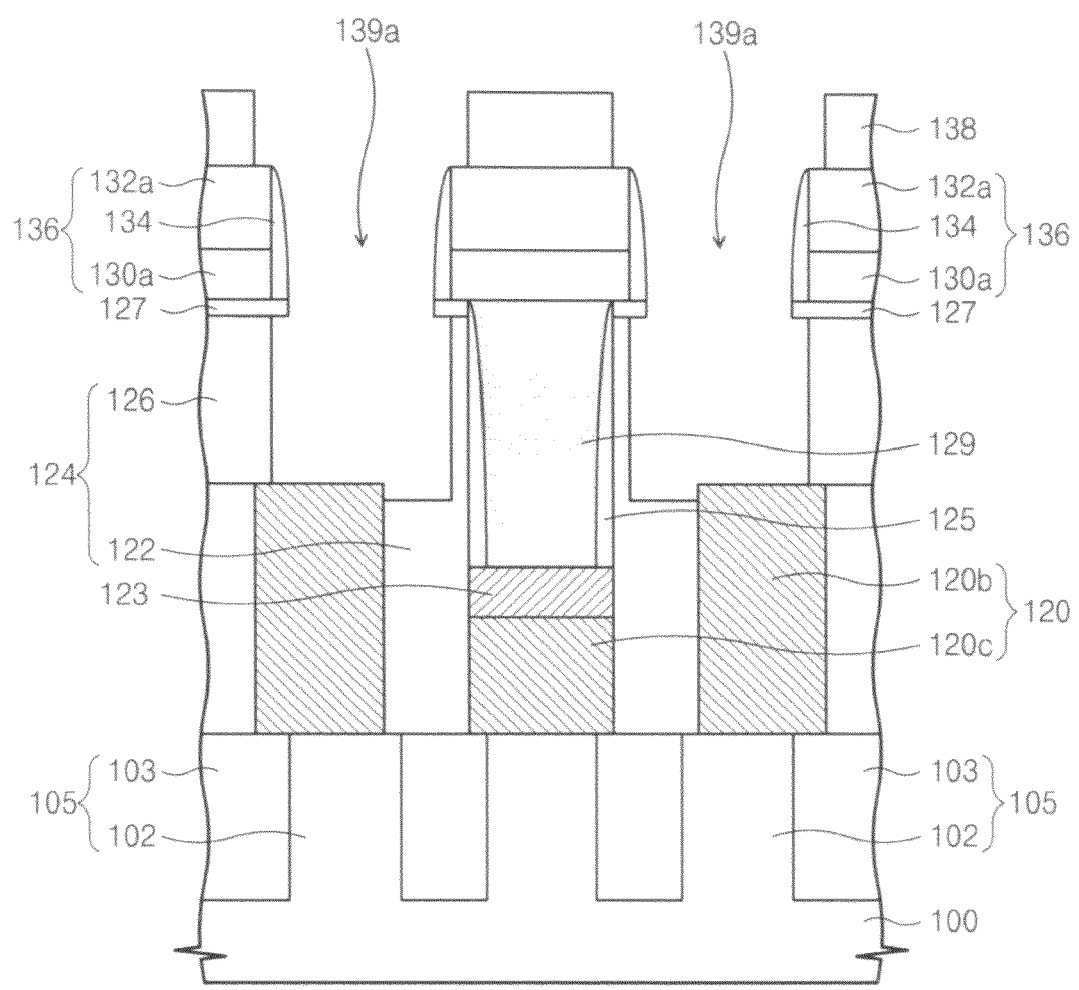

Referring to FIG. 6h, the semiconductor substrate 100 including the buried contact hole 139 may be etched using a wet etching process or a dry etching process to expand the buried contact hole 139. Thus, an expanded buried contact hole 139a may be formed. The first interlayer insulating layer 124 and/or the second interlayer insulating layer 138 may be etched but the bit line spacer 134 may not be etched. The bit line contact plug 129 and the bit line contact spacer 125 may not be exposed by the etching. A top surface and an upper side surface of the buried contact pad 120b may be exposed.

Expanding the buried contact hole may include etching the first interlayer insulating layer 124 using an etching method having an etching selectivity with respect to the etch stop layer 127. Accordingly, a buried contact plug that will be described later and the bit line conductive pattern 130a may be electrically insulated. Consequently, the etch stop layer 127 may increase a process margin.

Figure 6I:
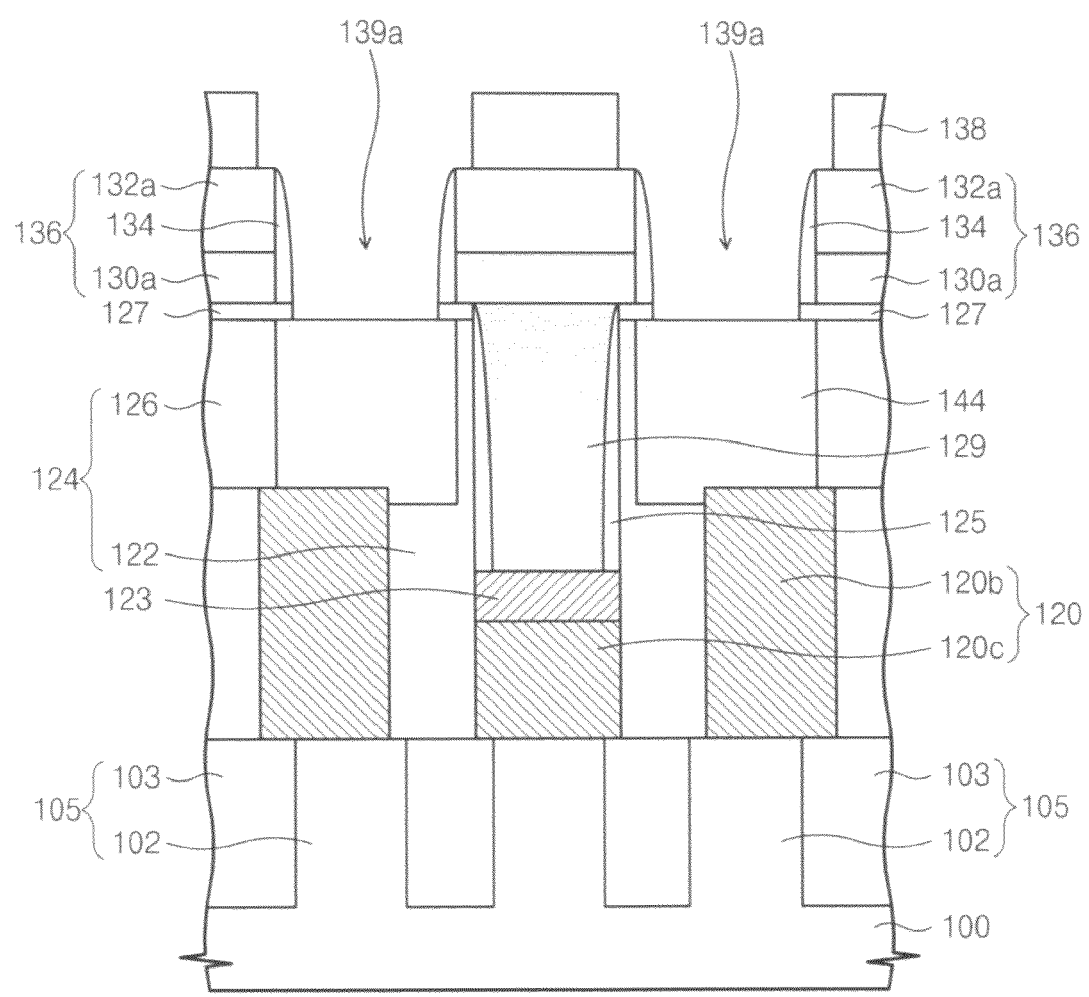

Referring to FIG. 6i, a conductive material filling the expanded buried contact hole 139a may be formed on the semiconductor substrate 100. The conductive material may include at least one of polysilicon and tungsten. When the conductive material is tungsten, a barrier metal may be further formed in a lower portion of the tungsten. The conductive material may be etched back to form a first buried contact plug 144. The etch-back process may be a selective etching that etches the conductive material. The etch-back process may be a wet etching or a dry etching. The etch-back process may be performed until the bit line spacer 134 is exposed. A contact area between the first buried contact plug 140 and the buried contact pad 120b may increase to reduce a contact resistance between them. According to example embodiments, metal silicide may be further included between the buried contact pad 120b and the first buried contact plug 140.

Referring to FIG. 3 again, a buried contact spacer layer may be conformally formed on the semiconductor substrate 100 including the first buried contact plug 140. The buried contact spacer layer may uniformly cover a side surface of the buried contact hole 139a and a top surface of the first buried contact plug 140. Subsequently, the buried contact spacer layer may be anisotropically etched to form the buried contact spacer 142. Conductive material may be deposited to fill the buried contact hole 139a. The conductive material may be planarized to form a second buried contact plug 144. The second buried contact plug 144 may include at least one of polysilicon and tungsten. The planarization may be performed using an etch-back process or a chemical mechanical polishing (CMP) process.

The first buried contact spacer 142 may prevent or reduce a dielectric breakdown between the bit line 136 and the second buried contact plug 144. A buried contact plug 146 may include the first and second buried contact plugs 140 and 144. The buried contact plug 146 may include a first part having a first width (d1) and a second part having a second width (d2) formed on the first part. The first width (d1) may be greater than the second width (d2). Thus, a contact area between the buried contact pad 120b and the buried contact plug 146 increases to reduce a contact resistance between them. The first part having the first width (d1) may be disposed on the first contact plug 140 and the second part having the second width (d2) may be disposed on the second contact plug 144. Subsequently, a process of forming a capacitor may be performed.

Figure 7A:
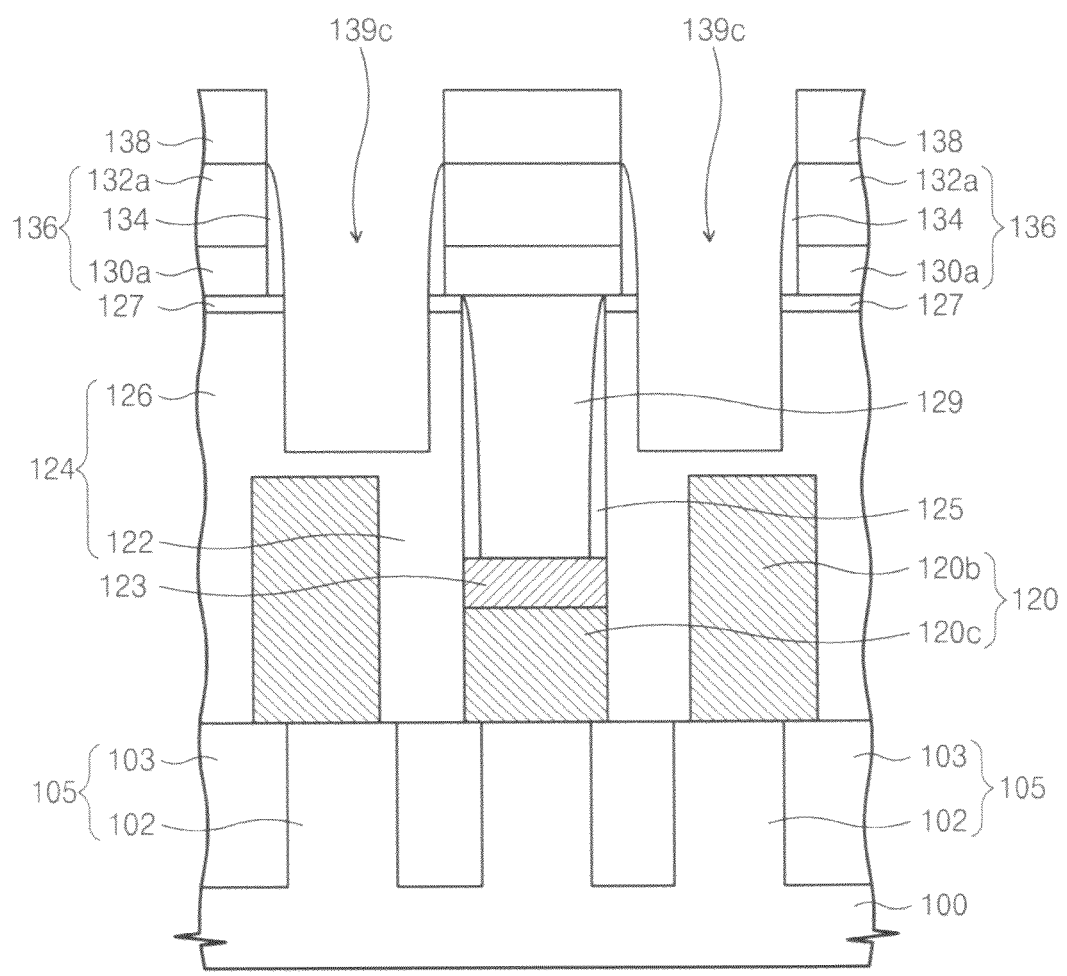

FIGS. 7a through 7d are cross sectional views taken along the line I-I' of FIG. 1 illustrating a method of forming a memory device in accordance with example embodiments. Referring to FIG. 7a, a second interlayer insulating layer may be formed on a bit line 136 as described in FIGS. 6a-6f. A buried contact mask pattern (not shown) may be formed on the semiconductor substrate 100 including the second interlayer insulating layer 138. The second interlayer insulating layer 138 and the first interlayer insulating layer 124 may be etched using the buried contact mask pattern as an etch mask down to a top surface of the buried contact pad 120b to form a buried contact hole 139c. The buried contact pad 120b may not be exposed by the etching. The etching may be an anisotropic etching. The buried contact hole 139c may be self aligned by a bit line hard mask pattern 132a and a bit line spacer 134. An etching of the first and second interlayer insulating layers 124 and 138 may have an etching selectivity with respect to the bit line hard mask pattern 132a and the bit line spacer 134.

Figure 7B:
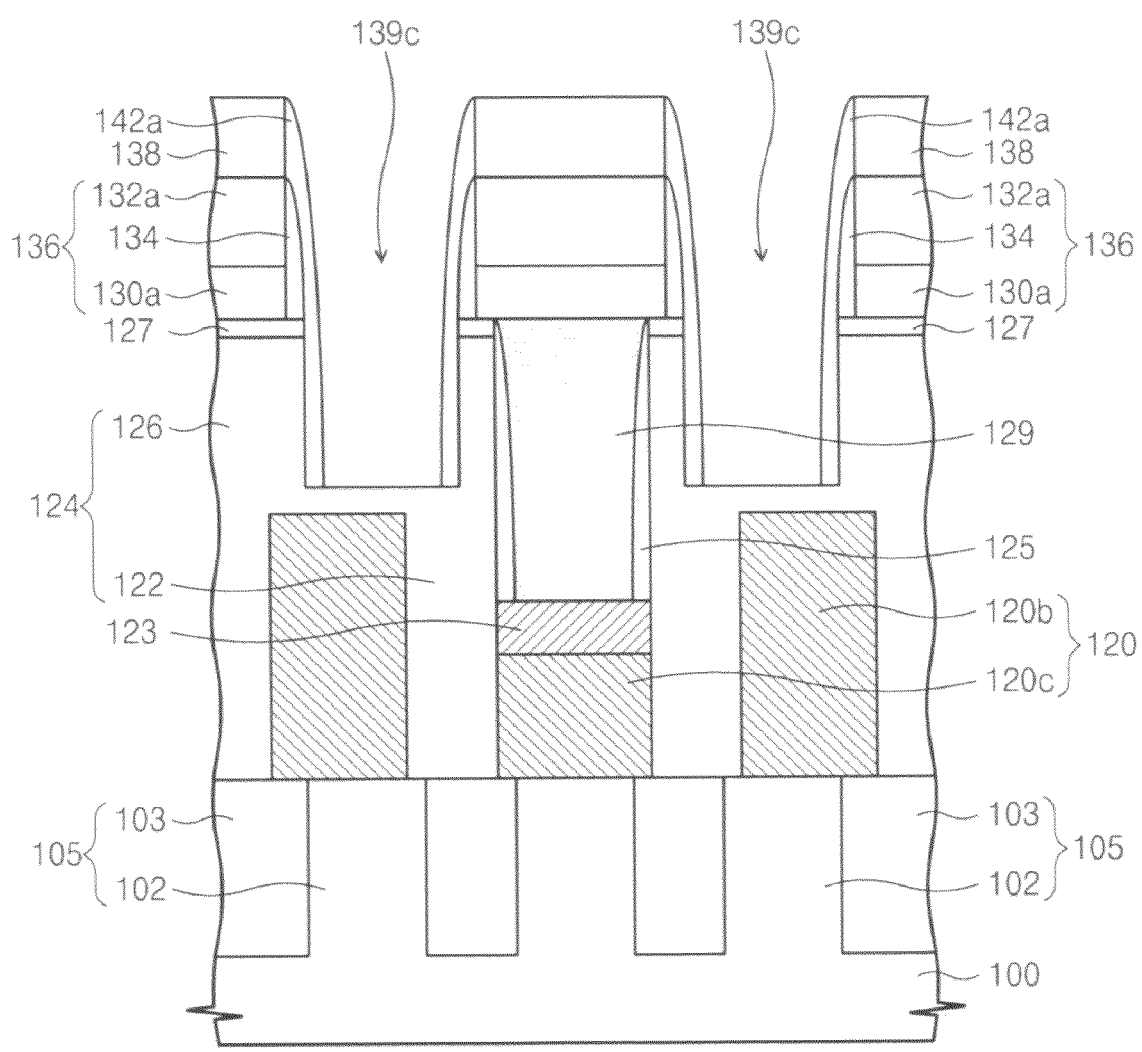
Figure 7C:
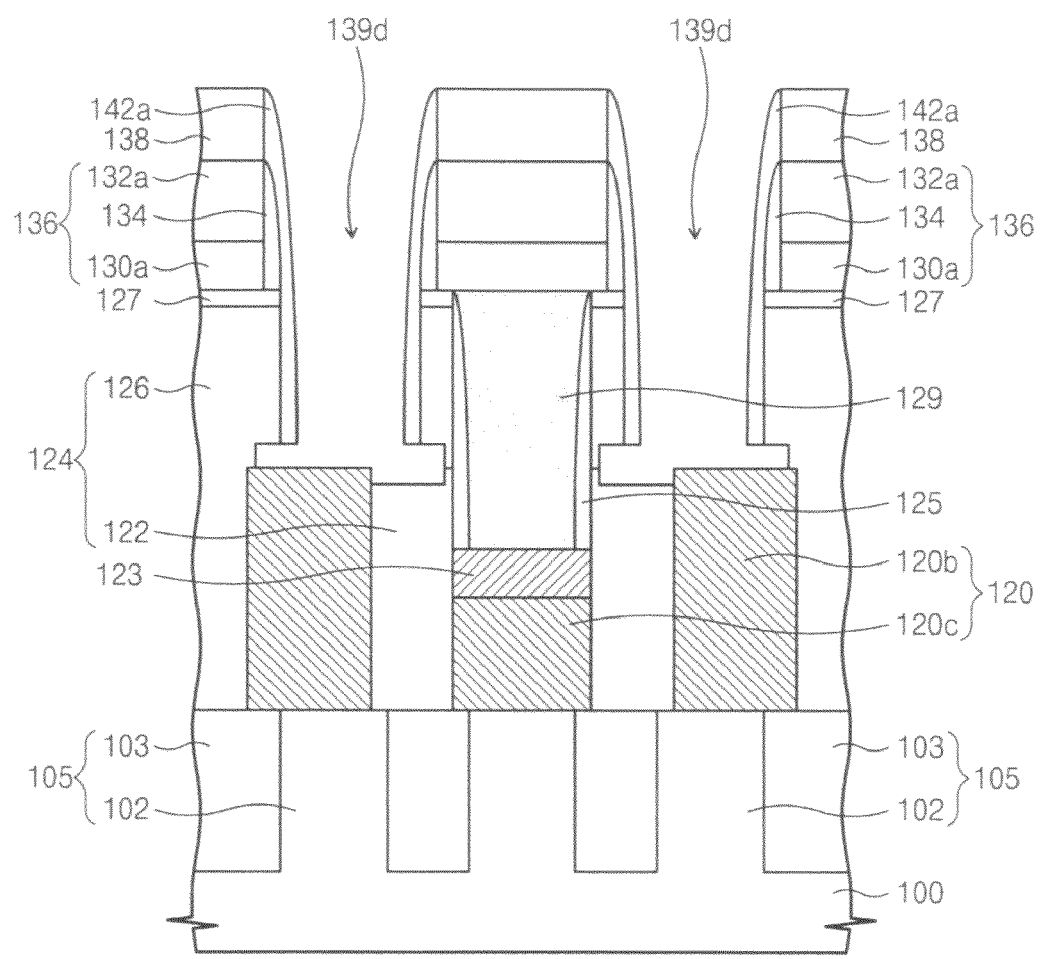

Referring to FIGS. 7b and 7c, a buried contact spacer layer may be conformally formed on the semiconductor substrate 100 including the buried contact hole 139c. The buried contact spacer layer may be anisotropically etched to form a buried contact spacer 142a. The buried contact spacer 142a may include at least one of a silicon nitride layer and a silicon oxynitride layer. The buried contact spacer 142a may not be in contact with the buried contact pad 120b.

Subsequently, the first interlayer insulating layer 124 may be etched to expand the buried contact hole 139c so that a top surface and an upper side surface of the buried contact pad 120b may be exposed. The etching may be an anisotropic etching. Expanding the buried contact hole may include etching the first interlayer insulating layer 124 using an etching method having an etching selectivity with respect to the buried contact spacer 142a. Thus, an exposed area of the buried contact pad 120b may increase. The buried contact hole 139 may become an expanded buried contact hole 139d.

Referring to FIG. 4 again, a conductive material may be formed on the semiconductor substrate 100 including the expanded buried contact hole 139d. The conductive material may fill the expanded buried contact hole 139d. The conductive material may be planarized to form a buried contact plug 146a. According to example embodiments, metal silicide may be formed between the buried contact plug 146a and the buried contact pad 120b. The buried contact plug 146a may include a first part having a first width (d1) and a second part having a second width (d2). The first width (d1) may be greater than the second width (d2). A method of forming a memory device according to example embodiments may not include the etch stop layer 127. Subsequently, a process of forming a capacitor may be performed.

While example embodiments have been particularly shown and described with reference to example embodiments thereof, it will be understood by one of ordinary skill in the art that various changes in form and details may be made therein without departing from the spirit and scope of example embodiments as defined by the following claims.

What is claimed is:

1. A method of forming a memory device, comprising:
    forming a buried contact pad and a bit line on a semiconductor substrate;
    forming a buried contact plug on one side of the bit line and connected to the buried contact pad;
    forming a bit line contact pad and a bit line contact plug connected to the bit line contact pad on the semiconductor substrate;
    forming an interlayer insulating layer between the bit line contact pad, the bit line contact plug, the bit line, the buried contact pad and the buried contact plug; and
    forming a buried contact spacer between the buried contact plug and the bit line,
    wherein the buried contact plug has a width that is greater at a part near a top surface of the buried contact pad than on one side of the bit line, and
    wherein forming the buried contact plug includes,
        forming a buried contact hole exposing a portion of the buried contact pad and laterally expanding under the bit line to form an expanded lower region of the buried contact hole,
        forming a first buried contact plug in the expanded lower region of the buried contact hole and connected to the buried contact pad; and forming a second buried contact plug on the first buried contact plug, the second buried contact plug filling an upper region of the buried contact hole, wherein forming the buried contact hole further includes, patterning the interlayer insulating layer to form a preliminary buried contact hole having a bottom surface lower than a bottom surface of the bit line, and forming a bit line spacer on a sidewall of the preliminary buried contact hole, wherein the bit line spacer is formed to have a bottom surface lower than the bottom surface of the bit line, and wherein the bottom surface of the buried contact spacer and a top surface of the first buried contact plug are on a same surface.

2. The method of claim 1, wherein the bit line spacer is formed of material having an etching selectivity with respect to the interlayer insulating layer, and forming the buried contact hole further comprises:

isotropically etching the interlayer insulating layer under the bit line spacer using the bit line spacer as an etching mask to expand a width of the buried contact hole.

3. The method of claim 1, wherein forming the bit line contact plug comprises:

patterning the interlayer insulating layer to form a bit line contact hole exposing the bit line contact pad;

recessing the buried contact pad to form the bit line contact pad having a top surface lower than a top surface of the buried contact pad; and forming metal silicide on the bit line contact pad.

4. The method of claim 3, wherein forming the bit line contact plug comprises:

forming a bit line contact spacer on a side surface of the bit line contact hole on the metal silicide.

* * * * *